US006737338B2

United States Patent
Takeda

(10) Patent No.: US 6,737,338 B2
(45) Date of Patent: May 18, 2004

(54) PATTERN FORMING METHOD FOR A DISPLAY DEVICE

(75) Inventor: Hitoshi Takeda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/367,146

(22) Filed: Feb. 13, 2003

(65) Prior Publication Data

US 2003/0165781 A1 Sep. 4, 2003

(30) Foreign Application Priority Data

Mar. 4, 2002 (JP) ......................................... 2002-58043

(51) Int. Cl.$^7$ .......................... H01L 21/00; H01L 51/40; H01L 21/82; H01L 21/30; H01L 21/20
(52) U.S. Cl. ........................... 438/479; 438/30; 438/66; 438/67; 438/70; 438/82; 438/99; 438/128; 438/149; 438/456; 438/587; 438/669; 438/708; 438/715; 438/716; 438/778; 438/482; 438/949
(58) Field of Search .............................. 438/30, 66, 67, 438/70, 82, 99, 128, 149, 456, 479, 587, 669, 708, 715, 716, 778, 482, 949

(56) References Cited

U.S. PATENT DOCUMENTS 4,469,777 A  *  9/1984  O'Neil ........................ 430/315
4,851,363 A  *  7/1989  Troxell et al. ............... 438/151
4,897,338 A  *  1/1990  Spicciati et al. ............. 430/314
6,602,790 B2 *  8/2003  Kian et al. ................... 438/690
2003/0092267 A1 *  5/2003  Kian et al. ................... 438/690

FOREIGN PATENT DOCUMENTS

JP          06-003826        1/1994
JP          06-186550        7/1994

* cited by examiner

Primary Examiner—John F. Niebling
Assistant Examiner—Stanetta Isaac
(74) Attorney, Agent, or Firm—David G. Conlin; J. Mark Konieczny; Edwards & Angell, LLP

(57) ABSTRACT

A pattern forming method of the present invention for forming a predetermined pattern on a photosensitive resin film by (i) layering the photosensitive resin film on an inorganic thin film with which a plastic substrate is coated and (ii) exposing the photosensitive resin film via a photomask having the predetermined pattern in an exposing step is characterized by including the step of heating the plastic substrate having the inorganic thin film before the exposing step, a time from an end of the heating step to a start of the exposing step being managed to be not less than a predetermined time, in accordance with an asymptotic contracting behavior after the end of the heating step of the plastic substrate having the inorganic thin film. With this, it is possible to provide a pattern forming method capable of forming a plurality of patterns on a plastic substrate with high accuracy of superposition, and a display device manufactured using the same.

18 Claims, 11 Drawing Sheets

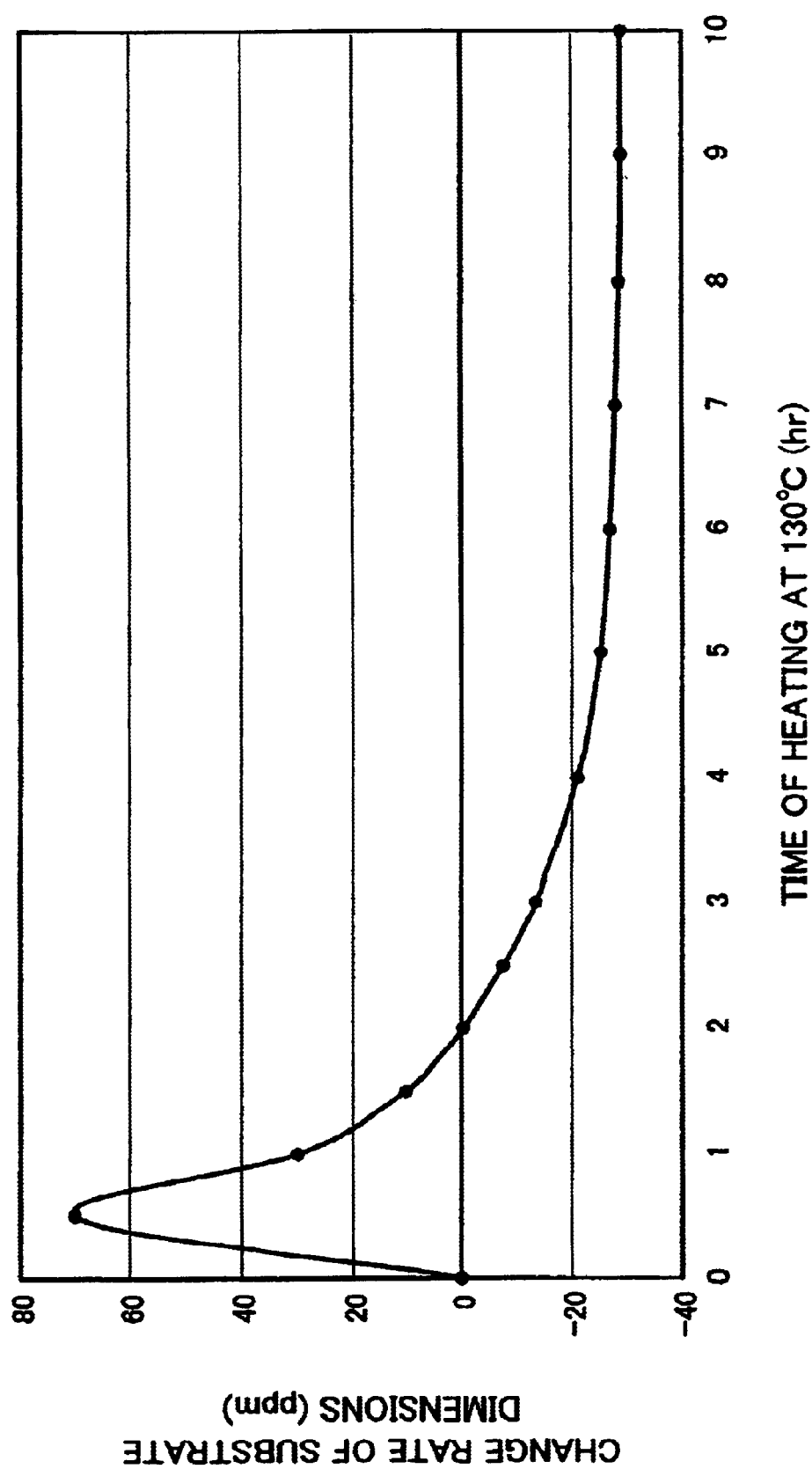

FIG. 4(a) STABLE DIMENSIONS OF THE SUBSTRATE AT 23°C
MOISTURE CONTENT ABSORBED IN THE SUBSTRATE: MINIMUM

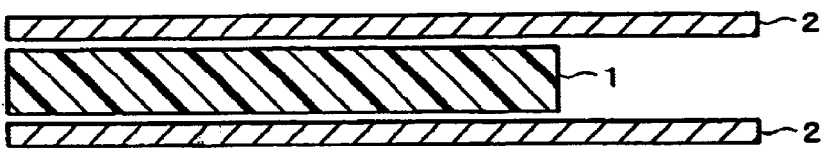

FIG. 4(b) DIRECTLY AFTER COOLING THE SUBSTRATE TO 23°C
MOISTURE CONTENT ABSORBED IN THE SUBSTRATE: MINIMUM

FIG. 4(c) AFTER LEAVING THE SUBSTRATE FOR 100 HOURS AT 23°C 0%RH
MOISTURE CONTENT ABSORBED IN THE SUBSTRATE: MINIMUM

FIG. 4(d) AFTER LEAVING THE SUBSTRATE FOR 100 HOURS AT 23°C 50%RH
MOISTURE CONTENT ABSORBED IN THE SUBSTRATE: LARGE

FIG. 4(e) DIRECTLY AFTER COOLING THE SUBSTRATE FOLLOWING A VERY SHORT TIME OF HEATING
MOISTURE CONTENT ABSORBED IN THE SUBSTRATE: SAME AS (d)

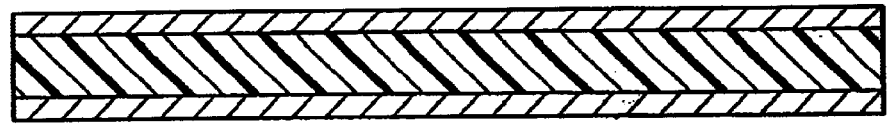

FIG. 4(f) DIRECTLY AFTER COOLING THE SUBSTRATE FOLLOWING 30 MINUTES OF HEATING
MOISTURE CONTENT ABSORBED IN THE SUBSTRATE: SLIGHTLY SMALLER THAN (d)

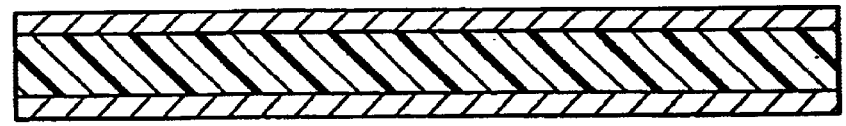

FIG. 4(g) WHEN LEAVING THE SUBSTRATE FOR 100 HOURS WITHOUT CHANGING THE MOISTURE CONTENT ABSORBED IN THE SUBSTRATE AFTER COOLING THE SUBSTRATE FOLLOWING 30 MINUTES OF HEATING
MOISTURE CONTENT ABSORBED IN THE SUBSTRATE: SAME AS (f)

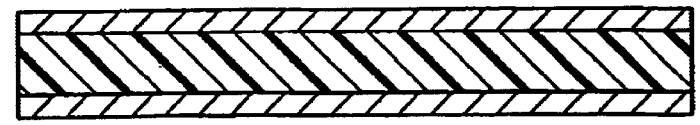

PATTERN FORMING METHOD FOR A DISPLAY DEVICE

FIELD OF THE INVENTION

The present invention relates to a pattern forming method for forming a predetermined pattern by a photolithography method on a plastic substrate which composes a display device such as a liquid crystal display device, an organic EL display device, an electrophoresis display device, etc., and a display device manufactured using the same.

BACKGROUND OF THE INVENTION

When a predetermined pattern is formed by a photolithography method on a substrate which composes a display device, the pattern is often required to be formed with high accuracy of dimension and position. For example, in a case of a pair of substrates which compose a liquid crystal display device, a transparent conductive film composed of Indium Tin Oxide (ITO) having a predetermined pattern is formed on each of the substrates, and then the pair of substrates are pasted with each other so that the both patterns face one another with predetermined accuracy of superposition. Thus, the predetermined patterns that are respectively formed on the substrates are required to be formed within a relatively constant range of dimensional accuracy.

Further, a color filter used for a liquid crystal display device is manufactured in such a manner that a plurality of patterns including a colored light-transmitting pattern of light's three primary colors such as RGB, a light-shielding pattern such as a black matrix, etc. are sequentially formed. Thus, the respective patterns are required to be formed within a constant range of accuracy of superposition. The accuracy of superposition here is mainly achieved by relative accuracy of dimension and position among the respective formed patterns. The higher definition of a manufactured color filter pattern requires higher accuracy of superposition, and thus requires higher accuracy of dimension and position for each of the formed patterns. Further, a transparent electrode for liquid crystal driving composed of ITO is required to be formed on the color filter with the same accuracy.

For example, when the formed pattern of the color filter and the formed pattern of the ITO for liquid crystal driving are both formed with high accuracy of dimension and position, the both patterns are formed with fine accuracy of superposition over an entire substrate, so that each of driving ITOs 101 corresponds to one color of color filters R•G•B, as shown in FIG. 11(a). In contrast, when the accuracy of dimension and position is not good, positional misalignment occurs. When the accuracy of superposition of the both patterns is not good, namely an amount of the positional misalignment exceeds a tolerance, a so-called color mixture defect occurs, in which one ITO 101 does not correspond to only one color of the color filters R•G•B, but corresponds to two or more adjacent colors of the color filters R•G•B. FIG. 11(b) is an example where the color mixture defect occurs due to low accuracy of dimension, FIG. 11(c) is an example where the color mixture defect occurs due to low accuracy of position, and FIG. 11(d) is an example where the color mixture defect occurs due to low accuracy of both dimension and position.

Incidentally, a liquid crystal display device, etc., is generally manufactured in such a manner that a plurality of panel patterns are simultaneously formed in a large substrate, and, after undergoing various processes, the large substrate is separated into respective panels. The size of the substrate used is from approximately 300 mm square to not less than 1000 mm square. Thus, an entire surface of the substrate must satisfy the accuracy of dimension and position and the accuracy of superposition, which are required for forming the patterns.

Here, the accuracy of dimension and position for forming a pattern by a photolithography method is determined mainly at an exposing step, so that it largely depends on the performance of a developing device, photomask's accuracy of dimension and form, the performance of photosensitive resin, etc.

However, when the relative accuracy in superposition of a plurality of patterns is required, as in the above-described liquid crystal display device, required is not only the accuracy of dimension and position of the pattern that is formed at the exposing step. Even if the pattern can achieve high accuracy of dimension at the exposing step, when the substrate itself changes in dimension due to thermal expansion, etc., the dimensions of the already formed pattern also change. This causes a dimensional error between the pattern that is already formed and the pattern that is newly formed, thereby lowering accuracy of superposition between the respective formed patterns. Thus, at the exposing of the newly formed pattern, it is required to control the substrate dimensions so that the dimensions and form of the already formed pattern are retained.

Nowadays, as a substrate for a display device such as a liquid crystal display device, an organic EL display device, an electrophoresis display device, etc., a plastic substrate has come to be used instead of a conventional glass substrate. The plastic substrate has advantages over the glass substrate in terms of lightness in weight, shock resistance, flexibility, etc. However, the plastic substrate widely changes in dimension by a slight temperature change because of its high coefficient of thermal expansion. The plastic substrate also expands due to moisture absorption. As described above, the plastic substrate requires a higher level of technique of dimensional control, because the plastic substrate changes in dimension more than the glass substrate.

In order to control the dimensional change of the substrate due to the thermal expansion, the substrate temperature during the exposing should be controlled, so that general exposing devices have a structure capable of adjusting a substrate temperature. However, in order to achieve the accuracy of dimensional control of the plastic substrate same as that of the glass substrate, the exposing device must have about twice to tenth higher accuracy of adjusting the substrate temperature, depending on concrete materials and compositions of the plastic and the glass.

In order to control the dimensional change of the substrate due to the moisture absorption, it is highly effective to employ a method to control a moisture content of the substrate, such as inhibition of the moisture absorption using a hard-coat layer, dehydration of the substrate by heating, moisture absorption by rinsing, etc., as disclosed in Japanese Unexamined Patent Publication No. 6-186550/1994 (Tokukaihei 6-186550, published on Jul. 8, 1994), for example.

Incidentally, it is conventionally assumed that a dimensional behavior of the plastic substrate mainly depends on "the dimensional change due to the thermal expansion" and "the dimensional change due to the moisture absorption"; thus, when the pattern is formed by the photolithography method, it is assumed that the dimensional behavior of the plastic substrate can be controlled by "control of the substrate temperature at the exposing" and "control of the moisture content of the substrate at the exposing", enabling the pattern formation with high accuracy of dimension and superposition.

However, the above-described pattern forming method has problems as described below.

Specifically, as to the method for the "control of the moisture content of the substrate at the exposing", when the substrate is exposed after heated for reducing the moisture content of the substrate to a certain level, for example, the substrate may be arranged so as to include a moisture barrier layer such as a hard-coat layer, to inhibit the moisture absorption. This can reduce the speed of substrate expansion due to the moisture absorption after the end of the baking, and thus reduces the dimensional variations among the formed patterns due to the variations in exposing timing, thereby achieving the high accuracy of dimensional control.

The barrier layer for inhibiting the moisture absorption of the substrate is excellently an inorganic thin film, for example, and the inorganic thin film having a denser film structure, in particular, has higher barrier properties. However, even the plastic substrate, having the dense inorganic thin film on each of both sides so as to inhibit the moisture absorption of the substrate, gradually absorbs moisture through a long leaving time, so that the plastic substrate expands. Thus, in order to maintain the dimensional accuracy of the substrate, so as to achieve the accuracy in superposition of a plurality of formed patterns, the pattern is presumably formed in a following manner: the moisture content of the plastic substrate, which has the inorganic thin film as the moisture barrier layer on each of both sides so as to reduce the speed of moisture absorption, is reduced to a certain level by heating of the substrate; and the exposing and the pattern formation are rapidly carried out under control of the substrate temperature, so that the dimensional change of the plastic substrate due to the expansion by the moisture absorption is kept within a predetermined range.

However, it turned out that, when the plastic substrate having the dense inorganic thin film was cooled down, after heating, to a certain temperature and left, the substrate dimensions were not gradually expanded by the moisture absorption, but, on the contrary, gradually contracted. In other words, it turned out that the dimensional behavior of the plastic substrate did not solely depend on "the dimensional change due to the thermal expansion" and "the dimensional change due to the moisture absorption". Thus, the accuracy in superposition of formed patterns on the plastic substrate having the dense inorganic thin film cannot be achieved by rapidly exposing the plastic substrate after heating, under control of the substrate temperature.

SUMMARY OF THE INVENTION

The object of the present invention is to provide a pattern forming method capable of forming a plurality of patterns on a plastic substrate with high accuracy of superposition, and a display device manufactured using the same.

In order to attain the foregoing object, a pattern forming method of the present invention for forming a predetermined pattern on a photosensitive resin film by (i) layering the photosensitive resin film on an inorganic thin film with which a plastic substrate is coated and (ii) exposing the photosensitive resin film via a photomask having the predetermined pattern in an exposing step is characterized by including the step of heating the plastic substrate having the inorganic thin film before the exposing step, a time from an end of the heating step to a start of the exposing step being managed to be not less than a predetermined time, in accordance with an asymptotic contracting behavior after the end of the heating step of the plastic substrate having the inorganic thin film.

Compared with the glass substrate, the plastic substrate having the inorganic thin film requires a higher level of technique of dimensional control, thereby having difficulty in achieving accuracy in pattern formation. As for this explanation, the inventors of the present invention have found that the plastic substrate having the inorganic thin film does not immediately become stable in dimension, but keeps asymptotically contracting, after keeping the substrate temperature constant by cooling the substrate following the heating step.

Thus, the high accuracy of dimensional control of the substrate cannot be achieved directly after the heating step, but can be achieved when the contraction rate of the substrate decreases in accordance with the asymptotic contracting behavior. Thus, with managing a time from the end of the heating step to the start of the exposing step of the substrate to be not less than the predetermined time, a predetermined pattern should be formed on the photosensitive resin by exposing the photosensitive resin film via the photomask having a predetermined pattern in the exposing step. This enables the pattern formation with high accuracy of dimension, thereby achieving high accuracy in superposition of patterns when a plurality of patterns are formed.

As a result, it is possible to provide a pattern forming method capable of forming a plurality of patterns on the plastic substrate.

In order to attain the foregoing object, a display device of the present invention, manufactured using a pattern forming method for forming a predetermined pattern on a photosensitive resin film by (i) layering the photosensitive resin film on an inorganic thin film with which a plastic substrate is coated and (ii) exposing the photosensitive resin film via a photomask having the predetermined pattern in an exposing step, is characterized in that the pattern forming method includes the step of heating the plastic substrate having the inorganic thin film before the exposing step, a time from an end of the heating step to a start of the exposing step being managed to be not less than a predetermined time, in accordance with an asymptotic contracting behavior after the end of the heating step of the plastic substrate having the inorganic thin film.

With this arrangement, the display device is manufactured using a pattern forming method for forming a predetermined pattern on a photosensitive resin film by (i) layering the photosensitive resin film on an inorganic thin film with which a plastic substrate is coated and (ii) exposing the photosensitive resin film via a photomask having the predetermined pattern in an exposing step. Here, the pattern forming method includes the step of heating the plastic substrate having the inorganic thin film before the exposing step, and a time from an end of the heating step to a start of the exposing step is managed to be not less than a predetermined time, in accordance with an asymptotic contracting behavior after the end of the heating step of the plastic substrate having the inorganic thin film. With this, it is possible to easily manufacture a high definition display device using the plastic substrate, such as a liquid crystal display device, an organic EL display device, an electrophoresis display device, etc., which was conventionally difficult to be manufactured.

For a fuller understanding of the nature and advantages of the invention, reference should be made to the ensuing

BRIEF DESCRIPTION OF THE DRAWINGS

FIG. 3 is a graph showing an example of characteristics of relation between a time of heating at 130° C. and a change rate of substrate dimensions, with respect to the plastic substrate having the inorganic thin film preferably used in the present invention.

FIGS. 4(a) through 4(g) are cross-sectional views schematically showing dimensions of a plastic substrate in various states, for explaining the graph of FIG. 3.

DESCRIPTION OF THE EMBODIMENTS

[Embodiment 1]

The following will explain an embodiment of the present invention with reference to FIGS. 1 through 3, 4(a) through 4(g), 5(a) through 5(d), and 6.

First, a dimensional behavior of a plastic substrate having an inorganic thin film, due to heating, cooling, and leaving, will be explained in detail.

Figure 2:
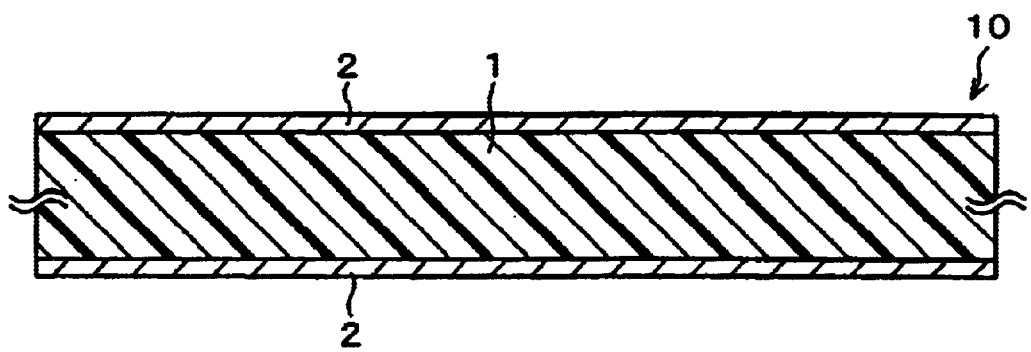
FIG. 2 is a cross-sectional view schematically showing an example of a plastic substrate having an inorganic thin film preferably used in the present invention.

First, as shown in FIG. 2, in a plastic substrate 10, an inorganic thin film 2 composed of silicon dioxide ($SiO_x$) is formed to have a thickness of 20 nm by sputtering at a substrate temperature of 130° C. on each of both sides of a plastic board 1 composed of epoxy resin having a thickness of 0.2 mm. The plastic substrate 10 is left in ambient conditions of 23° C. 50%RH for 100 hours. By setting a resultant state of the plastic substrate 10 as an initial state, (A) a heating time while the plastic substrate 10 keeps being heated to be 130° C. and (B) a change rate of substrate dimensions at the heating time with respect to the initial dimensions before the heating are obtained as shown in FIG. 3. Note that, the substrate dimensions are measured at the respective heating time in a following method. The plastic substrate 10 heated to be 130° C. is rapidly cooled down to have a substrate temperature of 23° C. at the measuring time, and a length of the plastic substrate 10 is measured. Further, after the substrate dimensions are measured, the plastic substrate 10 is heated again at the temperature of 130° C., and the heating time at the measuring time is a cumulative heating time.

As shown in FIG. 3, by heating the plastic substrate 10 to be 130° C., a moisture content of the substrate decreases, so that the substrate dimensions asymptotically contract in accordance with an increase of the heating time. Thus, after approximately 8 hours of the heating time, the substrate almost stops contracting. Namely, it can be inferred that 8 hours of heating at 130° C. almost eliminates the moisture contained in the plastic substrate 10.

Here, the substrate dimensions at a short heating time should be noted in FIG. 3.

Namely, as shown in FIG. 3, while the heating time is not more than 2 hours, the substrate dimensions become larger than the substrate dimensions directly before the heating, in spite of the assumption that the moisture content of the substrate decreases.

Next, a relation is measured between (A) a leaving time while the plastic substrate 10 is left in ambient conditions of 23° C. 50%RH after the plastic substrate 10 is heated for 8 hours at 130° C. and (B) the change rate of dimensions of the plastic substrate 10 at 23° C.

Figure 1:
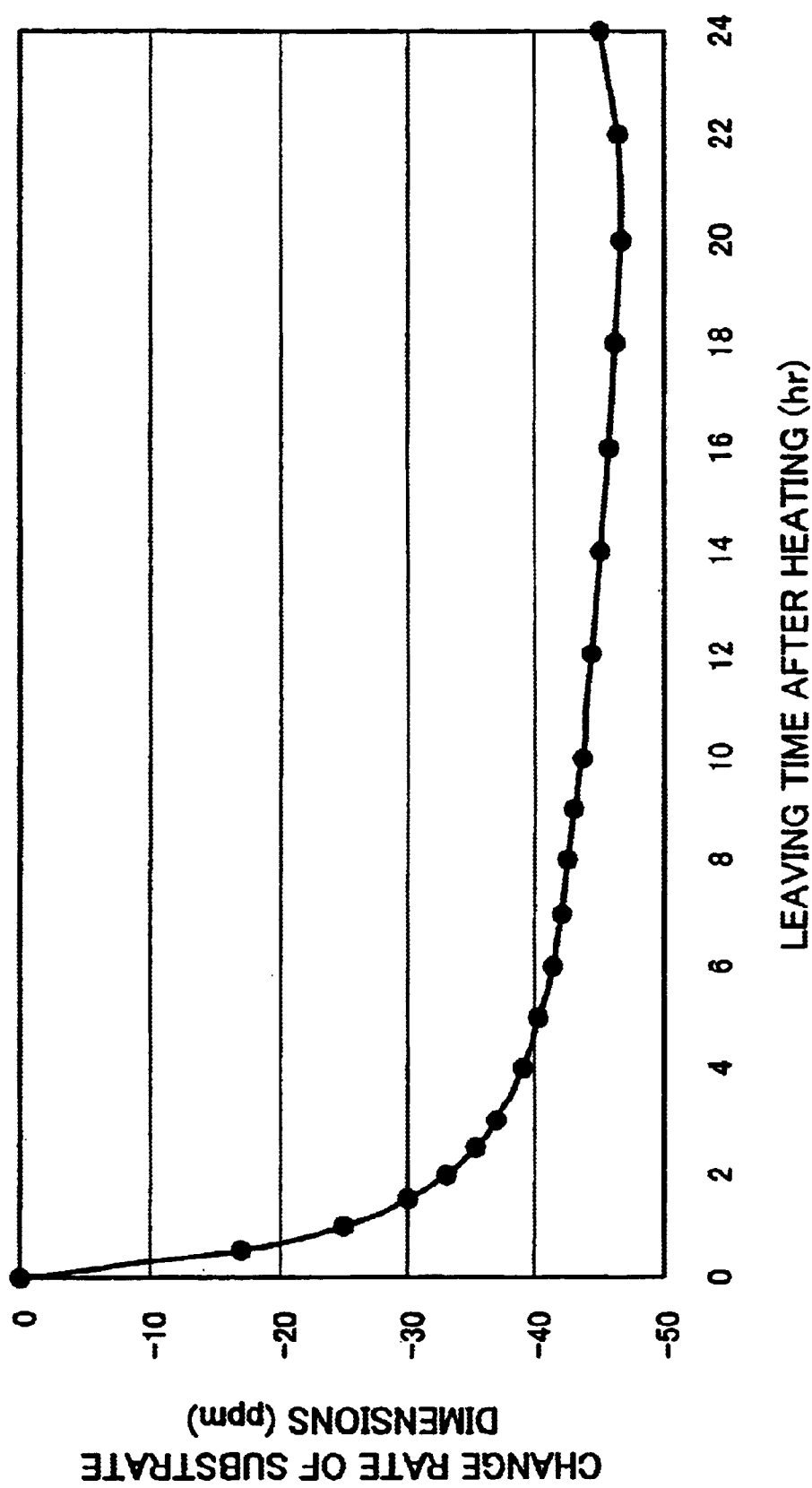
FIG. 1 is a graph showing an example of characteristics of relation between a leaving time after heating and a change rate of substrate dimensions, with respect to a plastic substrate preferably used in the present invention.

As a result, as shown in FIG. 1, in spite of the assumption that the moisture content of the plastic substrate 10 gradually increases by leaving the plastic substrate 10 in the ambient conditions of 23° C. 50%RH, the substrate dimensions keep asymptotically decreasing for approximately 20 hours from the start of the leaving, until the substrate dimensions finally starts increasing.

The above-described behavior of the plastic substrate 10, namely the expansion of the plastic substrate 10 as shown in FIG. 3 and the contraction of the plastic substrate 10 as shown in FIG. 1, cannot be explained only with "the dimensional change due to thermal expansion" and "the dimensional change due to moisture absorption."

The inventors of the present invention have found that the above-explained phenomenon is a hysteresis phenomenon caused by a difference of coefficient of thermal expansion between the plastic board 1 and the inorganic thin film 2 that has a dense structure; namely a phenomenon showing a behavior in which the plastic substrates 10 at the same ambient temperature and in the same state of moisture absorption may have different substrate dimensions in response to their different thermal histories.

The above-described behavior is explained as follows. In general steps of forming the inorganic thin film, the substrate is usually heated at a temperature of not less than 100° C. In the above-described arrangement, the inorganic thin film 2 is formed on the plastic board 1 by sputtering at 130° C. Here, the plastic board 1 is in a thermally-expanded state with respect to a state at a room temperature, and the inorganic thin film 2 is densely formed thereon.

However, the coefficient of thermal expansion of the formed inorganic thin film 2 is smaller than that of the plastic board 1. Thus, when the plastic substrate 10 is cooled down to the room temperature, the plastic board 1 contracts more than the inorganic thin film 2, thereby generating a difference between their inherently stable dimensions. This generates stress within the plastic board 1 and the inorganic thin film 2. Here, the thickness of the plastic board 1 is sufficiently larger than that of the inorganic thin film 2. Thus, the plastic board 1 contracts more strongly, thereby forcing the inorganic thin film 2 to contract to be smaller than its inherently stable dimensions. Namely, the inorganic thin film 2 that originally has a dense structure is further required to contract to have density higher than its inherently stable density. This causes a large time lag in the dimensional contraction, resulting in the hysteresis behavior.

Namely, it can be inferred that the contraction behavior of the plastic substrate 10 in FIGS. 3 and 1 is the hysteresis behavior caused by the fact that the originally dense inorganic thin film 2 contracts to have the density higher than its inherently stable density at 23° C.

Further, the expansion and contraction behavior of the plastic substrate 10 in FIG. 3 are caused by the fact that the substrate dimensions are smaller at the initial state after the inorganic thin film 2 has contracted for 100 hours to have higher density.

The above-described behavior will be explained with reference to cross-sectional views shown in FIGS. 4(a) through 4(g). When the inorganic thin film 2 is formed on the plastic board 1 by sputtering at 130° C., the plastic board 1 contains almost no moisture because of sputtering conditions of a high temperature in a vacuum. The inorganic thin film 2 in stable dimensions at 130° C. is formed on the plastic board 1 in stable dimensions at 130° C. in a state scarcely containing moisture, so as to compose the plastic substrate 10.

However, there is a difference in the stable dimensions at 23° C. between the plastic substrate 1 that scarcely contain water and the inorganic thin film 2, as shown in FIG. 4(a). When the plastic substrate 10 is cooled down to 23° C., the dimensions of the plastic substrate 10 directly after the cooling are quite larger than the inherently stable dimensions of the plastic board 1 at 23° C., as shown in FIG. 4(b), because the inorganic thin film 2 is dense and hard to contract. When the plastic substrate 10 is left for 100 hours in ambient conditions of 23° C. 0%RH, for example, so as not to absorb moisture, the dimensions of the plastic substrate 10 are expected to contract to the inherently stable dimensions of the plastic board 1 at 23° C., as shown in FIG. 4(c).

When the plastic substrate 10 is left for 100 hours in ambient conditions of 23° C. 50%RH, directly after the sputtering, the dimensions of the plastic substrate 10 of FIG. 4(d) become larger than the dimensions of the plastic substrate 10 of FIG. 4(c), because the moisture content of the substrate increases. However, the dimensions of the plastic substrate 10 of FIG. 4(d) are dimensions in which the inorganic thin film 2 has contracted for 100 hours to have higher density. As shown in FIG. 4(e), the dimensions of the plastic substrate 10, directly after cooling that follows heating for a short time so as not to reduce its moisture content, are expected to be larger than the dimensions of the plastic substrate 10 of FIG. 4(d) because the inorganic thin film 2 is hard to contract, and are expected to be larger than the dimensions of the plastic substrate 10 of FIG. 4(f) which is directly after cooling that follows 30 minutes of heating.

Further, when the plastic substrate 10 is left for 100 hours with maintaining the moisture content directly after the cooling that follows 30 minutes of heating, the dimensions of the substrate as shown in FIG. 4(g) are expected to be smaller than the dimensions of the plastic substrate 10 of FIG. 4(f) which is directly after the cooling, because the inorganic thin film 2 has contracted for 100 hours to have higher density, and are expected to be smaller than the dimensions of the plastic substrate 10 of FIG. 4(d) because 30 minutes of heating reduces the moisture content. Namely, the expansion and contraction behavior of the plastic substrate 10 in FIG. 3 are caused by the fact that the substrate dimensions are smaller at the initial state after the inorganic thin film 2 has contracted for 100 hours to have higher density.

In accordance with the dimensional behavior, due to heating, cooling, and leaving, of the plastic substrate in which the dense inorganic thin film is provided on the plastic board, the following will explain the present embodiment in detail.

First, a material of the plastic board that is used in the present embodiment is not limited as long as it has high transmittance of a spectrum of visible light, but is preferably a plastic material having high heat resistance, chemical resistance, dimensional stability, etc. in terms of a manufacturing process of a display device.

The above plastic material may be epoxy resin as described above and general polymeric materials such as polyethersulfone (PES), polycarbonate (PC), polyethylene terephthalate (PET), and polysulfone (PS).

Further, a material of the inorganic thin film that is used in the present embodiment is not limited as long as it has the property for realizing various functions that are required for an arrangement of the display device. However, an inorganic material such as silicon oxide ($SiO_x$), silicon nitride ($SiN_x$), and Indium Tin Oxide (ITO) is preferably used as a barrier layer that is provided for inhibiting moisture absorption of the plastic board. Thus, it is preferable that a thin film composed of the inorganic material is formed on each of both sides of the plastic board in order to inhibit the moisture absorption of the substrate in the manufacturing process. Note that, $SiO_x$ and $SiN_x$ are stoichiometrically expressed as $SiO_2$ and $Si_3N_4$, but they are expressed using "x" here, because they may have a component ratio that does not conform to the stoichiometry, depending on a method to form a film such as sputtering.

Further, ITO is generally used as a transparent conductive film for driving the display device, and is also used as an electrode for electrodeposition in a case such that a color filter is manufactured by an electrodeposition method.

Further, a method for forming the inorganic thin film is not particularly limited in the present embodiment, and may be a method in which an application method such as spin coating and dipping is applied and then baking is carried out. The method for forming the inorganic thin film may further be a sputtering method, an evaporation method, and other various methods. The sputtering method is particularly preferable in order to form the inorganic thin film having a dense structure and high property of inhibiting the moisture absorption of the substrate. Further, there are several types of the sputtering method, but the type is not particularly limited.

Further, in the present embodiment, to sufficiently inhibit the moisture absorption of the substrate, it is preferable that the inorganic thin film is formed on each of both sides of the plastic board, and it is more preferable that the inorganic thin film is formed by a sputtering method.

Further, photosensitive resin that is used in the present embodiment is not particularly limited, and may be a photo resist that is generally used. However, it is preferable to use a material which does not damage the plastic board and various thin films, etc. that are formed on the plastic board while a required photolithography process such as film forming and exposing is carried out. Further, the method to form the photosensitive resin into a film is not particularly limited, and may be a general method to form a film such as an application method such as spin coating and roll coating.

Here, a step of forming a photosensitive resin film through a step of forming a pattern will be explained with reference to FIGS. 5(a) through 5(d).

Figure 5A:
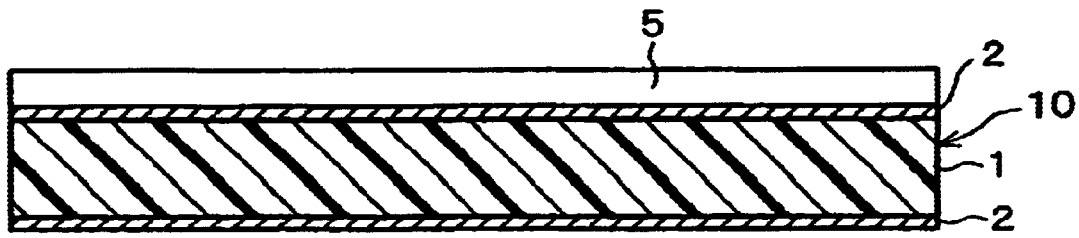
FIGS. 5(a) through 5(d) are cross-sectional views schematically showing steps of forming a pattern on a photosensitive resin film on a plastic substrate having an inorganic thin film.
Figure 5B:
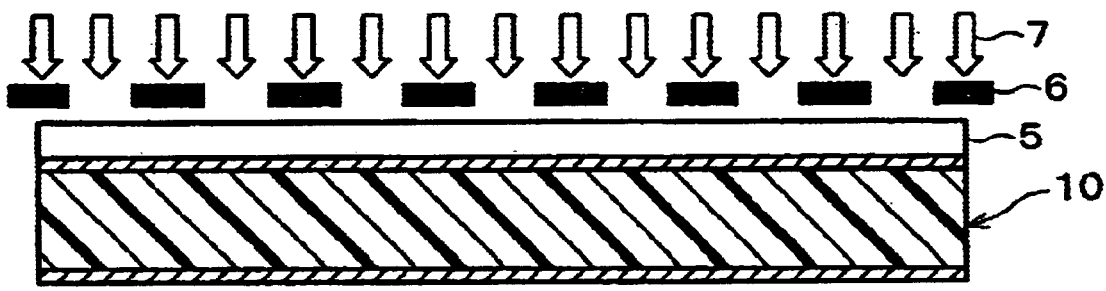
Figure 5C:
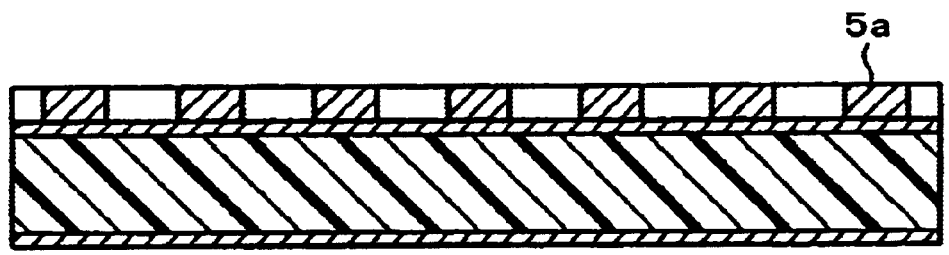
Figure 5D:
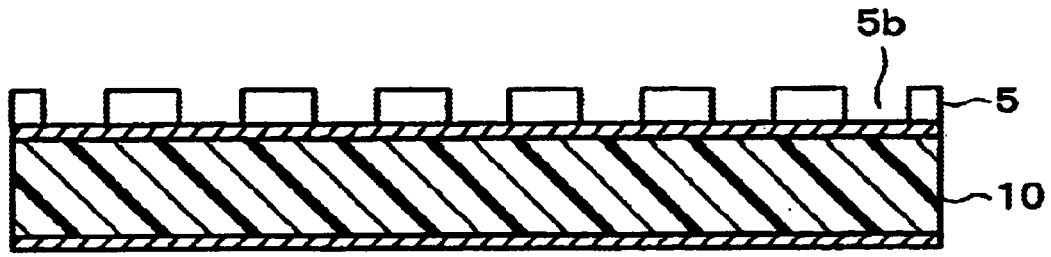

The photosensitive resin is generally supplied from a manufacturer in a form in which photosensitive resin or its precursor is solved in an organic solvent. After applied by the above-described application method, the photosensitive resin requires a heating step called pre-baking for evaporating the organic solvent or for carrying out thermal reaction on the precursor, so as to form a photosensitive resin film 5 as shown in FIG. 5(a). Following this, by exposing light 7 via a photomask 6 having a predetermined pattern as shown in FIG. 5(b), a latent image 5a is formed on a photosensitive resin film 5 as shown in FIG. 5(c). Further, after subjected to a heating step if necessary, a developing process is carried out so as to form a pattern on the photosensitive resin film 5 as shown in FIG. 5(d). Further, after subjected to a heating step if necessary, processing using the pattern formed on the photosensitive resin film 5 is carried out, such as etching on a base layer of a photosensitive resin film opening 5b, and electrodeposition on the photosensitive resin film opening 5b. In many cases, the photosensitive resin film 5 formed with the pattern is eliminated in the end.

In such usage, the pattern is formed on the photosensitive resin film 5 for patterning another function layer. In a color resist, etc. that is used for a color filter, however, a function layer to be patterned has photosensitivity, and is not eliminated after patterned. Further, the pattern may not be eliminated because of constraints of a manufacturing process as in a case of a material of a partition wall for cathode separation, used in an organic EL display device. The material is used only for forming a pattern of a cathode that is formed in a later step, and becomes unnecessary in the end.

The purpose of using the photosensitive resin that is used in the present embodiment is not limited. For example, the photosensitive resin itself may be formed with a pattern, or the formed pattern on the photosensitive resin may be used for patterning another function layer in a later step. Further, the final form of the photosensitive resin is not limited. For example, the photosensitive resin may be completely eliminated from the substrate in the end, or the photosensitive resin formed with the pattern may remain in a panel. Further, in FIGS. 5(a) through 5(d), the positive resist is used for explanation, but the resist may be either positive and negative types.

In the pattern forming method of the present embodiment, for forming a pattern by exposing the photosensitive resin film that is formed on the plastic substrate having the inorganic thin film, a time from (1) an end of a heating step, such as pre-baking of the photosensitive resin, before an exposing step to (2) a start of the exposing step is managed so as to be not less than a predetermined time.

The reason for performing this time management will be explained below.

In the step of heating the substrate before the exposing step, the plastic substrate having the inorganic thin film is thermally expanded. After the plastic substrate is cooled down, following the heating step, to a temperature for controlling the substrate at the exposing, the dimensions of the plastic substrate keep asymptotically contracting for a long time, as shown in FIG. 1 as an example. Here, immediately after the cooling, the substrate contracts at a high speed. Thus, the substrate dimensions at the exposing widely differ by a slight variation in exposing timing. As a result, when patterns are successively formed on the large number of substrates in a case such as mass production, the dimensions of the formed patterns are significantly varied when the substrate dimensions become stable after a long time has elapsed. Thus, when the plurality of patterns are sequentially formed, the accuracy in superposition of patterns cannot be achieved by exposing the substrate under control of the substrate temperature, immediately after heating the substrate.

Here, the plastic substrate after the heating step contracts asymptotically, so that the speed of contracting the substrate gradually decreases in accordance with time elapse from the end of the heating step. Thus, by providing a predetermined time between the heating step and the exposing step, the variations in the substrate dimensions at the exposing due to the variations in the exposing timing decrease, and thus the variations in the dimensions of the formed patterns decrease when the substrate dimensions become stable.

Thus, by setting a time from (1) the end of the heating step to (2) the start of the exposing step so that the variations, together with other pattern misalignment causes such as the accuracy of superposition at the pattern exposing and the accuracy of controlling the temperature of the exposing device, are within a tolerance accuracy in superposition of formed patterns, it is possible to achieve high accuracy in superposition of patterns when a plurality of patterns are sequentially formed.

The time from (1) the end of the heating step to (2) the start of the exposing step essentially should be set so that the dimensional variations in the formed patterns when the substrate dimensions become stable are sufficiently smaller than a tolerance accuracy in superposition of formed patterns which is determined based on specifications.

The inventors of the present invention have found that, in terms of a process margin, high accuracy in superposition of patterns can be achieved by setting a value of the dimensional change of the substrate to be not more than a half of a tolerance accuracy in superposition of formed patterns during 60 minutes from 30 minutes before the predetermined time to 30 minutes after the predetermined time.

This will be concretely explained with reference to FIG. 1. When a tolerance accuracy in superposition of formed patterns is 10 ppm (for example, 4.0 $\mu$m with respect to the substrate 10 having a size of 400 mm), a dimensional change during 60 minutes becomes 5 ppm, which is a half of the tolerance accuracy in superposition of formed patterns, during 60 minutes from 1.5 hours to 2.5 hours after leaving the substrate 10 following the heating. Thus, two or more hours are required from the end of the heating step to the start of the exposing step of the substrate 10 in order to obtain 10 $\mu$m of accuracy in superposition of patterns.

However, a time actually required from the end of the heating step to the start of the exposing step of the substrate varies due to the property of the inorganic thin film. Namely, when the inorganic thin film has high density and thickness, the inorganic thin film has strong power of inhibiting the moisture absorption of the substrate. This increases a time until the expansion of the substrate by the moisture absorption is observed after the substrate is heated, dehydrated, and left. This also easily varies an amount of dehydration among individual substrates after the heating. Further, when the inorganic thin film has too high density, the hysteresis behavior of the substrate dimensions becomes large, so that a long time is required until the contraction of the substrate dimensions becomes stable after the heating, and the dimensional behavior varies widely among individual substrates. This consequently increases a time until the start of the exposing step, which is required for achieving the accuracy in superposition of patterns.

As described above, because a longer time is required from the end of the heating step to the start of the exposing step, the plastic substrate having an extremely dense inorganic thin film is not preferably used because it is susceptible to a variety of variable factors in an actual manufacturing process, resulting in variations among the substrates. Thus, the inorganic thin film preferably has characteristics in which a time required from the end of the heating step to the start of the exposing step of the substrate is approximately not more than 150 minutes.

Figure 6:
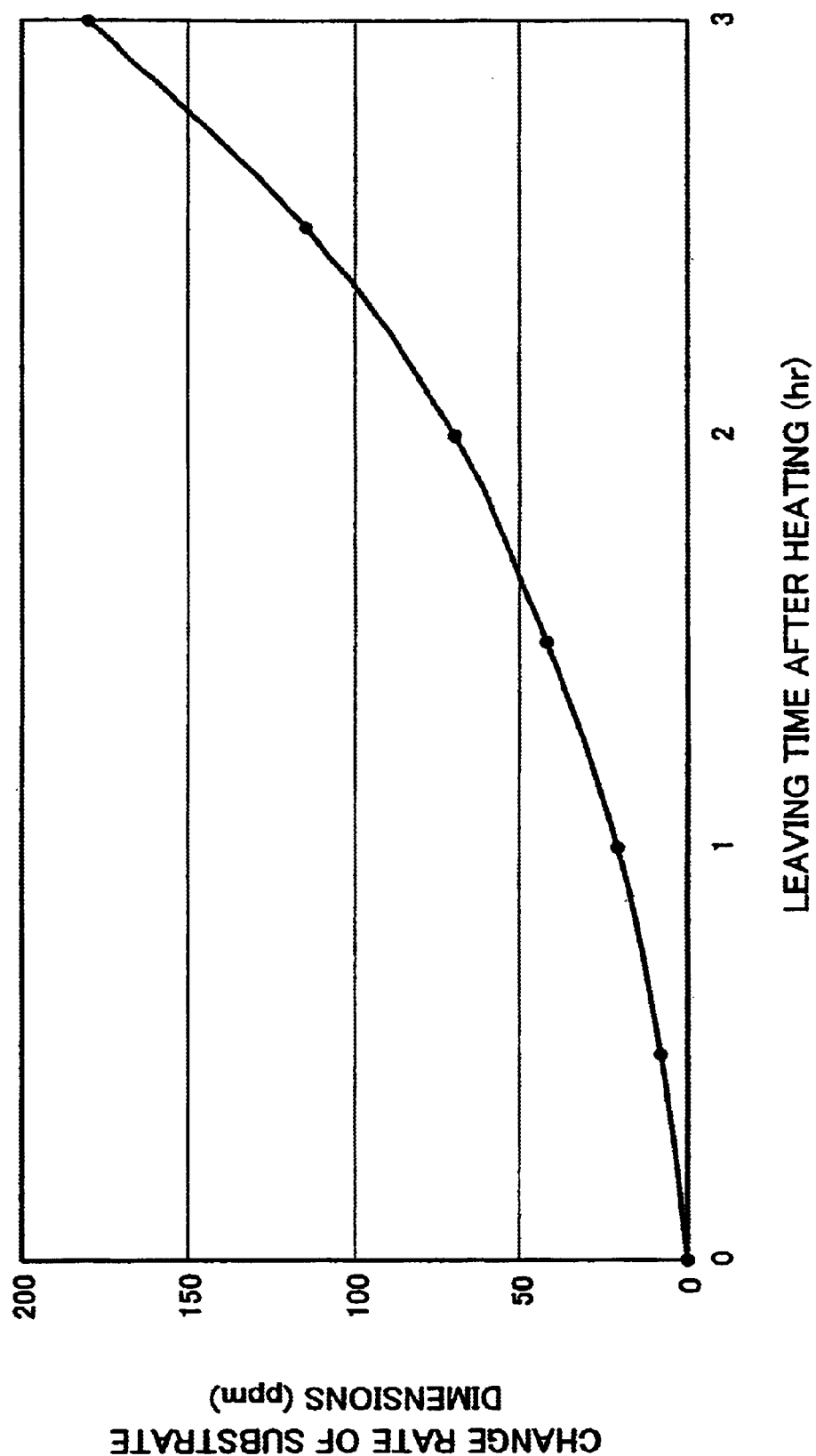
FIG. 6 is a graph showing an example of characteristics of relation between a leaving time in ambient conditions of 23° C. 50%RH after heating at 130° C. and a change rate of substrate dimensions, with respect to a plastic substrate that is not preferably used in the present invention.

On the other hand, when the inorganic thin film has low density, a shorter time is required until the contraction of the substrate dimensions become stable after the heating, and a shorter time is required until the expansion of the substrate by moisture absorption is observed after the heating. Thus, in the substrate that has characteristics in which less than 30 minutes is required until the start of the exposing step in accordance with the hysteresis behavior of the substrate dimensions, sufficient power of inhibiting the moisture absorption cannot be assumed in the inorganic thin film. In particular, when the inorganic thin film has too low density, it has no power of inhibiting the moisture absorption of the substrate, and it easily contracts to have higher density in accordance with the contraction of the substrate at the cooling. As a result, the hysteresis phenomenon caused by a difference in coefficient of thermal expansion between the inorganic thin film and the plastic board does not occur. Thus, when the substrate is left after the cooling following the heating, the substrate rapidly expands in a short time by absorbing moisture, as shown in FIG. 6. Further, though the expansion speed of the substrate is expected to decrease as the moisture content absorbed in the substrate approximates to a saturation value, the substrate exponentially expands in an initial state of the expansion as shown in FIG. 6. Thus, slight timing variations cause large variations in dimensions of the formed patterns, resulting in that a process margin cannot be obtained.

Thus, the inorganic thin film requires a certain level of density as its characteristics, and requires at least density in which the substrate dimensions keep asymptotically contracting for not less than one hour when the substrate is left after the cooling following the heating.

As described above, in terms of the process margin, it is desirable to adjust the density and thickness of the inorganic thin film by its forming conditions, etc., so that a certain level of accuracy in superposition of patterns is achieved in conditions that a time from the end of the heating step to the start of the exposing step of the substrate is approximately not less than 30 minutes and not more than 150 minutes.

According to the hysteresis behavior of the substrate dimensions after the heating, which has been found by the present inventors, the dimensions of the plastic substrate having the inorganic thin film asymptotically decrease. Thus, by managing a time from the end of the heating step to the start of the exposing step of the substrate to be not less than a predetermined time, the contraction of the substrate dimensions decreases, thereby achieving high accuracy in superposition of patterns.

However, the substrate keeps contracting after the predetermined time elapses, and, after a further long time elapses, expands by absorbing moisture. Thus, it is preferable that the variations in a time from the end of the heating step to the start of the exposing step of the substrate are small, in order to achieve higher accuracy in superposition of patterns. For example, the plastic substrate in which the property of the inorganic thin film is adjusted as described above, it is desirable that the variations in the time are within about 3 hours among the respective patterns or among the respective substrates. In other words, it is desirable that the time from the end of the heating step to the start of the exposing step of the substrate is from the predetermined time to 3 hours plus the predetermined time.

Further, in the present embodiment, it does not cause a problem when another step is carried out between the heating step and the exposing step of the substrate, so that not less than the predetermined time elapses from the end of the heating step to the start of the exposing step of the substrate. However, when no step is carried out between the heating step and the exposing step of the substrate, or when the other step only takes a time less than the predetermined time, the time is managed by providing a waiting step between the heating step and the exposing step of the substrate, so that the time from the end of the heating step to the start of the exposing step is not less than the predetermined time.

In the waiting step, it is desirable that the substrate is left in ambient conditions in which temperature and humidity are controlled. Specifically, the substrate is preferably left in ambient temperature and humidity same as ambient temperature and humidity in the exposing step, but the substrate may be left in an ambient temperature lower than the temperature in the exposing step in order to facilitate the stabilization of the substrate dimensions, or in ambient conditions in which the temperature and humidity are actively varied.

Further, the heating step of the substrate is not limited to the pre-baking of the photosensitive resin, and may be a heating step for simply reducing the moisture content of the substrate.

Further, when using photosensitive resin capable of subjected to exposure and development in a plurality of times, as disclosed in Japanese Unexamined Patent Publication No. 6-3826/1994 (Tokukaihei 6-3826; published on Jan. 14, 1994), the pre-baking is no longer required directly before the second or later exposing step.

Thus, in forming a first pattern, the pattern is formed on the photosensitive resin with managing a time from (1) the pre-baking of the photosensitive resin to (2) the exposing to be not less than the predetermined time. In forming a second pattern, the pattern is formed on the photosensitive resin with managing a time to be not less than the predetermined time, from (1) a heating step directly before an exposing step in forming the second pattern, among heating steps of the substrate required in processing steps such as electrodeposition, which are carried out after the first pattern is formed, to (2) the exposing step in forming the second pattern. Further, in forming a third or later pattern, as in the forming of the second pattern, the pattern is formed on the photosensitive resin with managing a time to be not less than the predetermined time, from (1) a heating step directly before an exposing step in forming the present pattern, among heating steps of the substrate required in processing steps such as electrodeposition, which are carried out after the precedent pattern is formed, to (2) the exposing step in forming the present pattern. As described above, the time is managed so that the time from (1) the end of any heating step required in the manufacturing process that is provided before an exposing step to (2) the start of the exposing step is not less than the predetermined time.

Note that, regarding the time management between the heating step and the exposing step for achieving accuracy in superposition of patterns, a technique apparently similar to the present embodiment is disclosed in Example 2 of Tokukaihei 6-186550; namely, "since a pitch of the black stripe gradually changes, it can be exactly aligned on the already formed pattern by managing a time between the pre-baking and the exposing."

However, as shown in the description directly before the above description, namely, "however, the pitch of the black stripe gradually widens when the substrate is left in a room", the technique is for controlling the pattern dimensions, using the dimensional change due to the expansion of the plastic substrate in accordance with the active moisture absorption. The technique of the present embodiment is for controlling the pattern dimensions in accordance with the asymptotic hysteresis behavior of the substrate dimensions due to the heating, cooling, and leaving with respect to the plastic substrate having the inorganic thin film formed by sputtering, which is based on an essentially different phenomenon. Thus, the technique of the present embodiment is completely different from the technique disclosed in Tokukaihei 6-186550.

Further, in the technique disclosed in Tokukaihei 6-186550, the time between the pre-baking and the exposing has to be strictly managed in order to achieve high accuracy in superposition of patterns, thereby having a narrow time margin in exposing timing. In contrast, the technique of the present embodiment is based on the asymptotic hysteresis behavior of the substrate dimensions, so that the time from the end of the heating step to the start of the exposing step of the substrate is only required to be not less than the predetermined time. Thus, as later described as concrete examples, the technique has a wide margin in exposing timing, being highly efficient in the manufacturing process.

As described above, compared with the glass substrate, the plastic substrate having the inorganic thin film requires a higher level of technique of dimensional control, thereby having difficulty in achieving accuracy in pattern formation. As for this explanation, the inventors of the present invention have found that the plastic substrate having the inorganic thin film does not immediately become stable in dimension, but keeps asymptotically contracting, after keeping the substrate temperature constant by cooling the substrate following the heating step.

Thus, the high accuracy of dimensional control of the substrate cannot be achieved directly after the heating step, but can be achieved when the contraction rate of the substrate decreases in accordance with the asymptotic contracting behavior. Thus, with managing a time from the end of the heating step to the start of the exposing step of the substrate to be not less than the predetermined time, a predetermined pattern should be formed on the photosensitive resin by exposing the photosensitive resin film via the photomask having a predetermined pattern in the exposing step. This enables the pattern formation with high accuracy of dimension, thereby achieving high accuracy in superposition of patterns when a plurality of patterns are formed.

As a result, it is possible to provide a pattern forming method capable of forming a plurality of patterns on the plastic substrate.

Further, in the pattern forming method of the present embodiment, when the inorganic thin film is formed by a sputtering method, in particular, the inorganic thin film is densely formed. With this, it is possible to achieve high accuracy of dimensional control of the substrate, thereby achieving high accuracy in superposition of patterns when a plurality of patterns are formed.

Further, in the pattern forming method of the present embodiment, when the inorganic thin film is formed on both sides of the plastic substrate, the inorganic thin films have an effect on both sides of the plastic substrate. With this, it is possible to achieve high accuracy of dimensional control of the substrate, thereby achieving high accuracy in superposition of patterns when a plurality of patterns are formed.

Further, in the pattern forming method of the present embodiment, when inorganic thin film is composed of one of silicon oxide, silicon nitride, and indium tin oxide, it is possible to achieve high accuracy of dimensional control of the substrate, thereby achieving high accuracy in superposition of patterns when a plurality of patterns are formed.

Incidentally, the above-described time management becomes useless when the contraction of the plastic substrate having the inorganic thin film cannot be specified in accordance with time elapse.

Here, in the present embodiment, dimensions of the plastic substrate., having the inorganic thin film keep asymptotically contracting for not less than one hour when kept at a constant ambient temperature after cooling the plastic substrate having the inorganic thin film, the cooling following heating step. Thus, by managing the time from the end of the heating step to the start of the exposing step of the substrate to be not less than the predetermined time, it is possible to achieve high accuracy of dimensional control of the substrate, thereby achieving high accuracy in superposition of patterns when a plurality of patterns are formed.

Further, in the pattern forming method of the present embodiment, the predetermined time is set so that, after the heating step of the plastic substrate having the inorganic thin film, the plastic substrate having the inorganic thin film has a value of dimensional change that is not more than a half of a tolerance accuracy in superposition of formed patterns during 60 minutes from 30 minutes before the predetermined time to 30 minutes after the predetermined time.

Namely, with this setting based on actual measurement, it is surely possible to achieve high accuracy of dimensional control of the substrate, thereby achieving high accuracy in superposition of patterns when a plurality of patterns are formed.

Further, in the pattern forming method of the present embodiment, by setting the predetermined time to be not less than 30 minutes and not more than 150 minutes, it is surely possible to achieve high accuracy of dimensional control of the substrate, thereby achieving high accuracy in superposition of patterns when a plurality of patterns are formed.

Incidentally, in the pattern forming method of the present embodiment, it is not sufficient to manage the time from the end of the heating step to the start of the exposing step of the plastic substrate having the inorganic thin film only to be not less than the predetermined time. Namely, when the leaving time is too long, a dimensional change of the substrate due to expansion by moisture absorption, etc., variations in substrate dimensions, etc. occur, thereby lowering the accuracy of dimensional control of the substrate.

Thus, in the present embodiment, a time from the end of the heating step to the start of the exposing step of the plastic substrate having the inorganic thin film is set to be not less than the predetermined time and not more than 3 hours plus the predetermined time. With this, it is surely possible to achieve high accuracy of dimensional control of the substrate, thereby achieving high accuracy in superposition of patterns when a plurality of patterns are formed.

Further, in the pattern forming method of the present embodiment, by providing a waiting step between the heating step and the exposing step of the plastic substrate having the inorganic thin film, it is surely possible to manage a time from the end of the heating step to the start of the exposing step of the substrate to be not less than the predetermined time.

Further, in the pattern forming method of the present embodiment, the waiting step is a step for leaving the plastic substrate having the inorganic thin film in ambient conditions in which temperature and humidity are controlled, thereby reducing variations in the asymptotic contracting behavior of the substrate among substrates and among processing steps. With this, it is possible to achieve high accuracy of dimensional control of the substrate, thereby achieving high accuracy in superposition of patterns when a plurality of patterns are formed.

[Embodiment 2]

Figure 7:
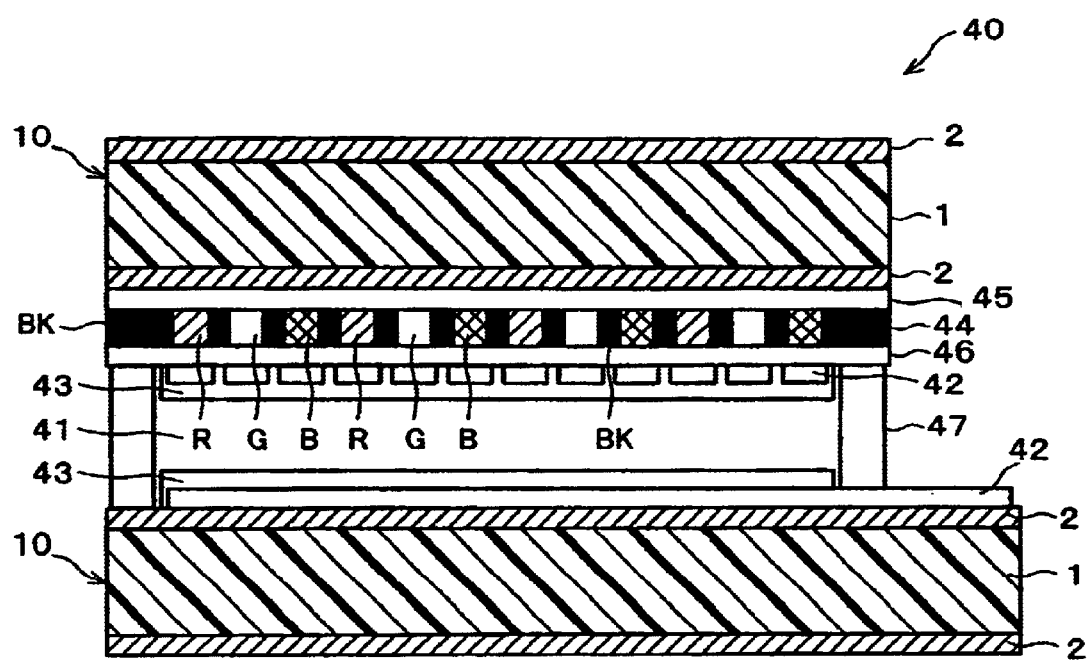
FIG. 7 is a cross-sectional view schematically showing an example of a liquid crystal display device manufactured using the pattern forming method of the present invention.
Figure 8:
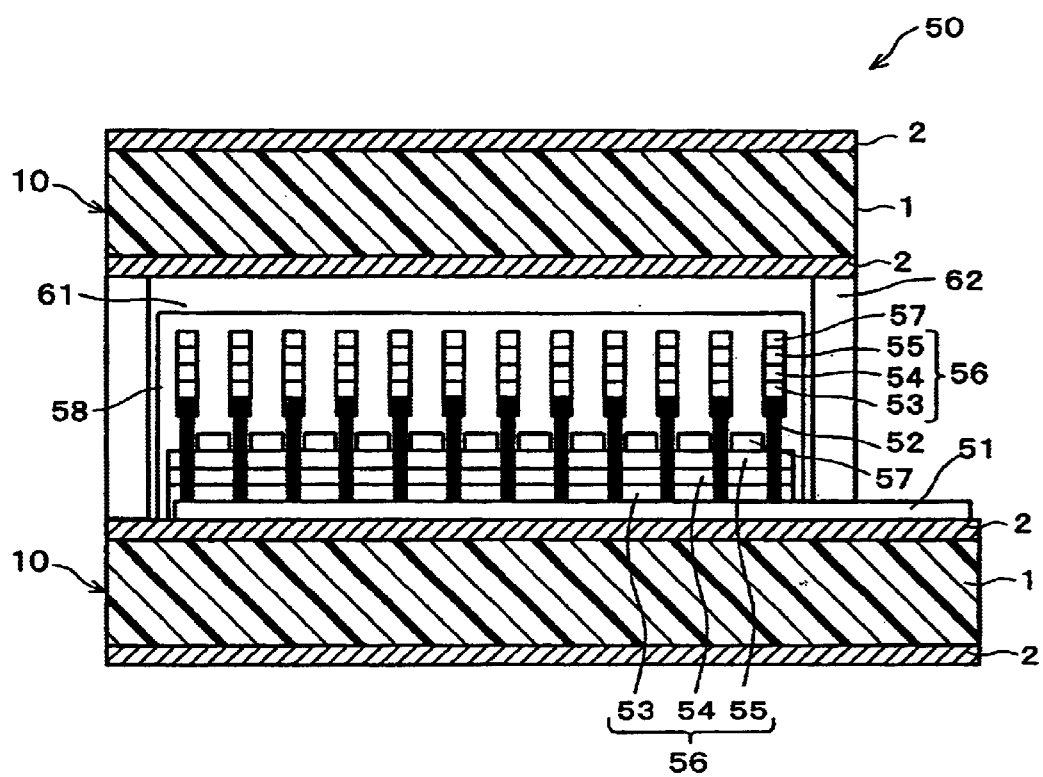
FIG. 8 is a cross-sectional view schematically showing an example of an organic EL display device for monochrome display manufactured using the pattern forming method of the present invention.

The following will explain another embodiment of the present invention with reference to FIGS. 7 and 8. Note that, for convenience, the same reference numerals are assigned to members which have same functions as those shown in Embodiment 1, and thus their explanation is omitted here.

In the present embodiment, a display device using the plastic substrate having the inorganic thin film in Embodiment 1 will be explained. Note that, in the present embodiment, a liquid crystal display device and an organic EL display device are used as examples, but the display device is not limited to them. A constituent element, a manufacturing method, application, and usage of the display device of the present invention, such as type, structure, and materials of the display device, are not limited, as long as the display device has a step of forming a pattern on the photosensitive resin on the plastic substrate using the pattern forming method of the present invention.

First, a case will be explained where the pattern forming method of the present embodiment is applied to a liquid crystal display device, using a concrete example.

The liquid crystal display device is composed as explained below. A pair of substrates, on which pixel electrodes are provided so as to individually drive liquid crystal materials in a pixel area by applying an electric field, are pasted with each other so as to sandwich the liquid crystal materials having a predetermined thickness. A display panel is composed of the above-arranged pair of substrates on which a polarization plate, a phase difference plate, a light diffusion plate, a reflection plate, etc. are further pasted if necessary. The liquid crystal display device is composed of the above-arranged display panel that is connected with a driving circuit, etc., and combined with a backlight unit, etc.

Among the pair of faced substrates that compose the liquid crystal display device, at least one of the substrates is required to be the plastic substrate having the inorganic thin film. Further, each of the pair of substrates has a structure in which a plurality of function layers at least including a transparent electrode layer for liquid crystal driving are layered. The function layer may be a moisture absorption control layer, a liquid crystal orientation control layer, a color filter layer, a planarizing layer, an insulating layer, a light diffusion layer, a reflection layer, etc. The function layer may also be a transparent electrode layer for color filter electrodeposition when the color filter layer is formed by an electrodeposition method, and may also be an active element layer for pixel driving such as a TFT (Thin Film Transistor) element and an MIM (Metal Insulator Metal) element when the liquid crystal display device is an active driving display device. The function layers may be used in combination if necessary.

Each of the constituent elements of the liquid crystal display device of the present embodiment can be formed using a general manufacturing method. When the general manufacturing method includes a step of forming a pattern on the photosensitive resin film, the pattern forming method of the present invention can be applied. In the manufacturing steps, the step of forming a pattern on the photosensitive resin film on the plastic substrate using the pattern forming method of the present embodiment may be a step of forming a color filter pattern, a step of forming a pattern of an electrode for liquid crystal driving, and a step of forming an active element for pixel driving, for example. The display device of the present invention may use the pattern forming method of the present invention in at least any one of manufacturing steps.

As a concrete example, FIG. 7 shows a cross-sectional view of a display panel in a liquid crystal display device for color display 40. Note that, the polarization plate, the phase difference plate, etc. that are further pasted outside on the pair of substrates are omitted here.

As shown in FIG. 7, a pair of plastic substrates 10 are respectively composed of the plastic board 1 that has a moisture absorption inhibition layer composed of the inorganic thin film 2 on each of both sides of the plastic board 1. On one side of one of the plastic substrates 10, a transparent electrode layer for color filter electrodeposition 45, a color filter layer 44, an overcoat layer for surface planarization and for insulation 46, a transparent electrode layer for liquid crystal driving 42, and a liquid crystal orientation control layer 43 are further layered. On the other plastic substrate 10, only the transparent electrode layer for liquid crystal driving 42 and the liquid crystal orientation control layer 43 are layered. The pair of the plastic substrates 10 are pasted with each other via a sealing agent 47 so as to sandwich liquid crystal materials 41. The pattern forming method of the present embodiment is used for forming a pattern of the color filter layer 44, and a pattern of the transparent electrode layer for liquid crystal driving 42 on the both plastic substrates 10.

Next, a case will be explained where the pattern forming method of the present embodiment is applied to an organic EL display device, using a concrete example.

The organic EL display device is composed as explained below. The plastic substrate is composed of the plastic board on which the inorganic thin film is formed on one or both sides of the plastic board for moisture barrier, oxygen barrier, etc. On the above-arranged plastic substrate, a driving electrode (anode) layer for hole injection, an organic material layer at least including a light-emitting layer, and a driving electrode (cathode) layer for electron injection are further layered sequentially in this order or in a reverse order, and, if necessary, a protection layer is further formed for moisture barrier, oxygen barrier, etc. A display panel is composed of the above-arranged plastic substrate on which an absorbent, an inert fluid such as dry nitrogen, fluorocarbon oil, etc. on the layered surface side of the layered product, are sealed with a back surface substrate. The organic EL display device is composed of the above-arranged display panel that is connected with a driving circuit, etc.

The organic material layer, which composes the organic EL display device, is composed of a light-emitting layer, and a function layer selected from the group including a hole injection layer, a hole transport layer, a hole injection transport layer, an electron injection layer, an electron transport layer, and an electron injection transport layer. The organic material layer can be formed using a general method.

The method to form the organic material layer is generally an evaporation method when a low molecular weight compound is used as the material, or an application method such as spin coating and roll coating, printing method, etc. when a high polymer material is used. In a multicolor display device, multicolor is achieved by a method in which one or more function layers, at least including the light-emitting layer among the organic material layers, are respectively formed with a multicolor display pattern using different materials per display color; or by a method in which the organic material layer, which is not formed with a multicolor display pattern, is uniformly made into a white-color light emitting layer so as to be combined with a color filter of the multicolor display pattern, or uniformly made into a blue-color light emitting layer so as to be combined with a color conversion filter of the multicolor display pattern.

When the color filter and the color conversion filter are used, a layer of either filter is usually formed on the plastic substrate having the inorganic thin film, and an overcoat layer is further formed thereon if necessary, on which at least (1) a transparent first driving electrode layer for hole or electron injection, (2) the inorganic material layer, and (3) a second driving electrode layer for electron or hole injection are further formed sequentially in this order. Light emitted from the organic material layer is used by taking out from the plastic substrate side via the filter.

Further, the driving electrode layer, which composes the organic EL display device, is formed with a pattern corresponding to a pixel pattern. However, a wet processing step after the formation of the organic material layer often deteriorates the property of the organic material layer. Thus, the second driving electrode layer, which is formed after the formation of the organic material layer, is formed using a dry processing method such as evaporation and sputtering via an aperture mask. Alternatively, the second driving electrode layer may be formed in such a manner that the first driving electrode layer is patterned on the substrate, a partition wall for electrode separation corresponding to a pattern of the second driving electrode layer is patterned, and, after the formation of the organic material layer, the second driving electrode layer is formed to be separated into the predetermined pattern by means of the partition wall for electrode separation, without the aperture mask having a micropattern, using a dry processing method such as evaporation, sputtering, etc.

Further, in an active driving display device, the active element for pixel driving such as the TFT element and the MIM element is usually formed next to the first driving electrode layer before the formation of the organic material layer.

Each of the constituent elements of the organic EL display device of the present embodiment can be formed using a general manufacturing method. When the general manufacturing method includes a step of forming a pattern on the photosensitive resin film, the pattern forming method of the present invention can be applied.

The step of forming a pattern on the photosensitive resin film on the plastic substrate using the pattern forming method of Embodiment 1 may be a step of forming a multicolor pattern, such as a step of forming respective color light-emitting patterns, a color filter pattern, and a color conversion filter pattern, a step of forming a pattern of a driving electrode, a step of forming a pattern of a partition wall for electrode separation, and a step of forming an active element for pixel driving, for example. The display device of the present invention may use the pattern forming method of Embodiment 1 in at least any one of manufacturing steps.

As a concrete example, FIG. 8 shows a cross-sectional view showing a display panel in an organic EL display device for monochrome display 50.

In the organic EL display device for monochrome display 50, as shown in FIG. 8, the plastic substrate 10 includes a moisture absorption inhibition layer made of the inorganic thin film 2 on each of both sides of the plastic substrate 10. Further, on one side of the plastic substrate 10, (1) a transparent driving electrode layer for hole injection 51 made of ITO as the first driving electrode layer, (2) a partition wall for cathode separation 52 made of photosensitive resin, (3) an organic material layer 56 composed of a hole injection transport layer 53, a light-emitting layer 54, and an electron injection transport layer 55, (4) a driving electrode layer for electron injection 57 made of a metal thin film as the second driving electrode layer, (5) a protection layer 58 made of an inorganic material are further layered sequentially in this order. In a manufacturing process of the organic EL display device for monochrome display 50, the organic material layer 56 and the driving electrode for electron injection 57 are formed into a film using evaporation without the aperture mask having the micropattern, but the organic material layer 56 and the driving electrode for electron injection 57 are formed separately on the driving electrode layer for hole injection 51 and on the partition wall for cathode separation 52 by means of the partition wall for cathode separation 52 that has already patterned, so that they are formed in a stripe pattern.

Further, in the organic EL display device for monochrome display 50, another plastic substrate 10, in which the moisture absorption inhibition layer made of the inorganic thin film 2 is formed on both sides, is pasted on the layered surface side of the above-described layered product via a sealing agent 62 so as to sandwich an inert gas 61.

In this structure, the pattern forming method of the present invention is used for forming a pattern of the driving electrode layer for hole injection 51 and a pattern of the partition wall for cathode separation 52.

As described above, the display device of the present embodiment is manufactured using the pattern forming method that is explained in Embodiment 1. With this, it is possible to easily manufacture a high definition display device using the plastic substrate, such as a liquid crystal display device, an organic EL display device, an electrophoresis display device, etc., which was conventionally difficult to be manufactured.

Note that, the liquid crystal display device and the organic EL display device have been used as concrete examples for explaining the display device of the present invention, but, as described before, the display device of the present invention is not limited to them. A constituent element, a manufacturing method, application, and usage of the display device of the present invention, such as type, structure, and materials of the display device, are not limited, as long as the display device has a step of forming a pattern on the photosensitive resin on the plastic substrate using the pattern forming method of the present invention.

The following will explain the present invention using concrete Examples.

EXAMPLE 1

Figure 9:
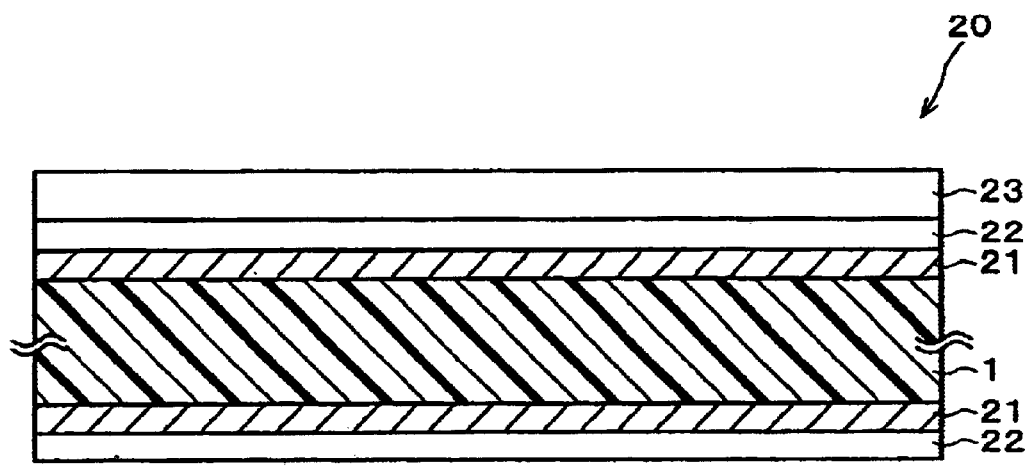
FIG. 9 is a cross-sectional view schematically showing a plastic substrate having an inorganic thin film in Examples of the present invention.

As shown in FIG. 9, a $SiO_x$ film 21 having a thickness of 10 nm, a $SiN_x$ film 22 having a thickness of 10 nm, an ITO film 23 having a thickness of 140 nm are sequentially formed in this order on an entire surface of a plastic board 1 using a reactive sputtering method at a temperature of 130° C. The plastic board 1 is made of epoxy resin having a size of 300×423 mm and a thickness of 0.2 mm. On the other hand, a $SiO_x$ film 21 having a thickness of 10 nm and a $SiN_x$ film 22 having a thickness of 10 nm are sequentially formed in this order on an entire back surface of the plastic board 1 using a reactive sputtering method at a temperature of 130° C. This completes a substrate 20.

After marking an area of 280×400 mm in the center of the substrate 20 by laser marker, the substrate 20 is heated for 10 hours at 130° C., and is rapidly cooled down to have a temperature of 23° C. The substrate 20 is then left in ambient conditions of 23° C. 50%RH, and dimensional changes of the marked area of 280×400 mm are measured in accordance with time elapse.

Figure 10:
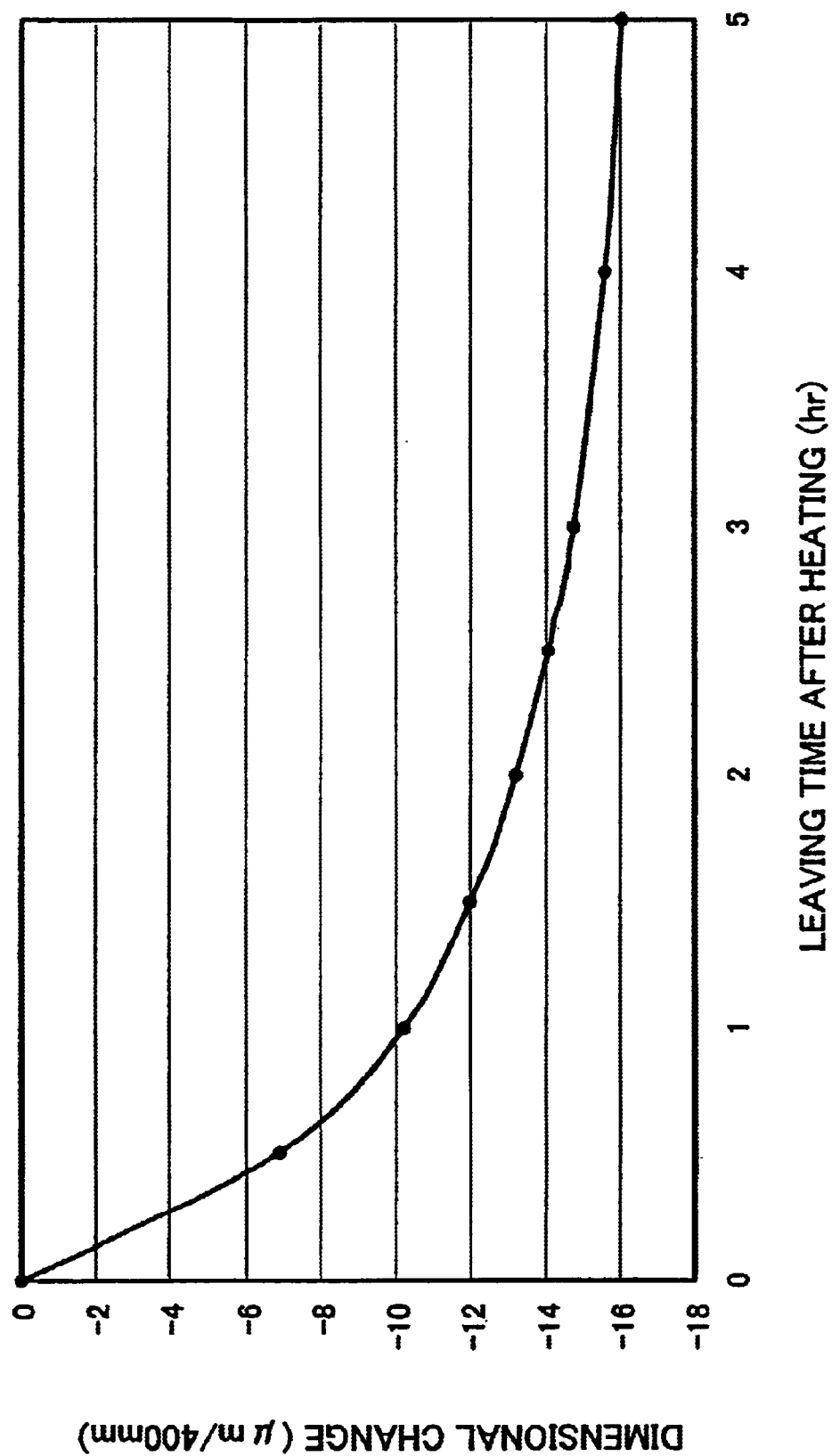
FIG. 10 is a graph showing an example of characteristics of relation between a leaving time after heating and a change rate of substrate dimensions, with respect to the plastic substrate having the inorganic thin film in Examples of the present invention.
Figure 11A:
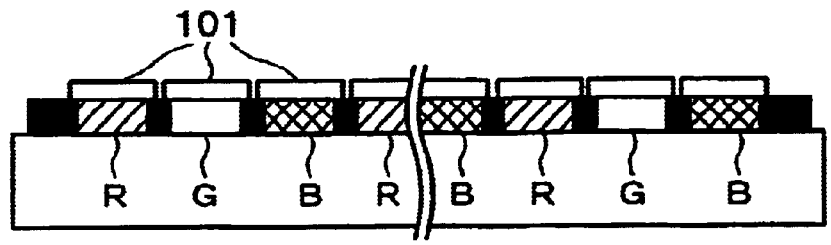
FIGS. 11(a) through (d) are cross-sectional views schematically showing pattern misalignment when the patterns are formed by a conventional pattern forming method of a liquid crystal display device.
Figure 11B:
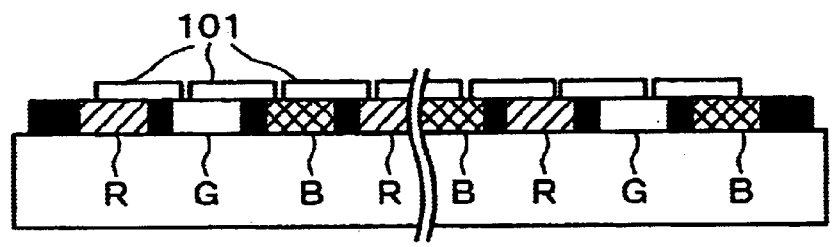
Figure 11C:
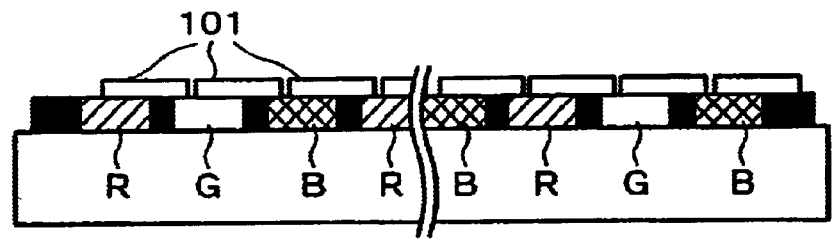
Figure 11D:
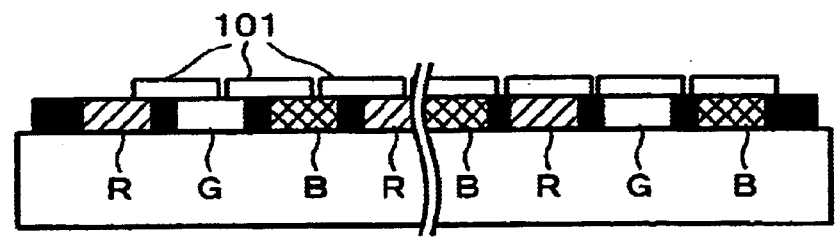

As a result, as shown in FIG. 10, a dimensional change per 400 mm is −7 μm after 30 minutes of leaving, and a dimensional change per 400 mm is −12 μm per 400 mm after 90 minutes of leaving. As a result, a difference in dimensions of the substrate during 60 minutes from 30 minutes to 90 minutes of leaving is 5 μm per 400 mm.

Thus, when a pattern having 10 μm of tolerance accuracy in superposition is formed on the substrate 20, for example, it is judged that a waiting step is preferably provided so that the time from the end of the heating step to the start of the exposing step is not less than 60 minutes. This is because, at a leaving time of 60 minutes after the heating, the dimensional change of the substrate during 60 minutes from 30 minutes before the leaving time to 30 minutes after the leaving time becomes 5 μm, which is a half of the tolerance.

Likewise, a difference in dimensions of the substrate during 60 minutes from 90 minutes to 150 minutes of leaving is 2 μm per 400 mm. Thus, when a pattern having 4 μm of tolerance accuracy in superposition is formed on the substrate 20, for example, it is judged that a waiting step is preferably provided so that the time from the end of the heating step to the start of the exposing step is not less than 120 minutes. This is because, at a leaving time of 120 minutes after the heating, the dimensional change of the substrate during 60 minutes from 30 minutes before the leaving time to 30 minutes after the leaving time becomes 2 μm, which is a half of the tolerance.

EXAMPLE 2

The substrate 20 that has the same structure as that of the substrate 20 used in Example 1 is heated for 10 hours at 130° C., so as to reduce a moisture content of the substrate 20. Next, a positive type photosensitive resin composition (trade name "Excelead PR-145") manufactured by Nippon Paint Co., Ltd. is applied on a surface of the substrate 20 by a spin coater. The substrate 20 is then subjected to pre-baking for 15 minutes at 130° C., so that a photosensitive resin film is formed on the ITO film. After the pre-baking, the substrate 20 is cooled down to have a temperature of 23° C., and left in ambient conditions of 23° C. 50%RH. The photosensitive resin film is then exposed at 23° C. via a photomask having a first pattern in which an effective area is 280×400 mm in the center of the substrate 20.

Here, with assuming that the tolerance accuracy in superposition is 10 μm, the waiting time is set so that a time from the end of the pre-baking to the exposing is exactly 60 minutes, based on the result of Example 1. Further, in order to facilitate chemical reaction at the exposed portion, the substrate 20 is heated for 10 minutes at 110° C. Then, the substrate 20 is developed with a liquid that is exclusively used for the photosensitive resin composition, so that the photosensitive resin film is eliminated at the exposed portion to reveal the surface of the ITO film in a shape of the first pattern.

Next, black color thermosetting electrodeposition paint (trade name "Excelead ED-BK-1403") manufactured by Nippon Paint, Co., Ltd. is electrodeposited on the ITO revealed portion of the substrate 20 using electrodeposition bath. The substrate 20 is then heated for 10 minutes at 130° C. for hardening the electrodeposition film, thereby forming a black color electrodeposition film BK having a shape of the first pattern.

Next, after the heating step for hardening the electrodeposition film, the substrate 20 is cooled down to have a temperature of 23° C., and left in ambient conditions of 23° C. 50%RH. The photosensitive resin film is then exposed at 23° C. via a photomask having a second pattern in which an effective area is 280×400 mm in the center of the substrate 20, so as to align the first pattern.

Here, with assuming that the tolerance accuracy in superposition is 10 μm, as in the formation of the first pattern, the waiting time is set so that a time from the end of the heating step for hardening the electrodeposition film to the exposing is exactly 60 minutes. Further, in order to facilitate chemical reaction at the exposed portion, the substrate 20 is heated for 10 minutes at 110° C. Then, the substrate 20 is developed with the liquid that is exclusively used for the photosensitive resin composition, so that the photosensitive resin film is eliminated at the exposed portion to reveal the surface of the ITO film in a shape of the second pattern.

Next, red color thermosetting electrodeposition paint (trade name "Excelead ED-R-1102R") manufactured by Nippon Paint, Co., Ltd. is electrodeposited on the ITO revealed portion of the substrate 20 using electrodeposition bath. The substrate 20 is then heated for 10 minutes at 130° C. for hardening the electrodeposition film, thereby forming a red color electrodeposition film R having a shape of the second pattern. As a result, a plastic substrate formed with the first pattern of the black color electrodeposition film BK and the second pattern of the red color electrodeposition film R is obtained.

When evaluating the accuracy in superposition of two patterns with respect to 100 substrates that are obtained in the above-described manner, the misalignment between the formed patterns is 5 μm in average and up to 8 μm, which are smaller than 10 μm of the assumed tolerance accuracy in superposition. Further, relative dimensional differences between the patterns are up to 4 μm, which satisfies the assumed tolerance accuracy of superposition.

EXAMPLE 3

The first pattern of the black color electrodeposition film BK and the second pattern of the red color electrodeposition film R are formed on a plastic substrate in the same manner as Example 2 except that the waiting times are set so that (i) the time from the end of pre-baking to the exposing of the first pattern and (ii) the time from the end of the heating step for hardening the black color electrodeposition film BK to the exposing of the second pattern are respectively 120 minutes.

When evaluating the accuracy in superposition of two patterns with respect to 100 substrates that are obtained in the above-described manner, the misalignment between the formed patterns is 2 μm in average and up to 4 μm. Further, relative dimensional differences between the patterns is up to 3 μm, whose accuracy in superposition of patterns is higher than that in Example 2 in which the assumed tolerance accuracy in superposition is 10 μm. Further, the results of the present example confirms the assumption based on Example 1 that 4 μm of accuracy of superposition can be achieved with the waiting time of 120 minutes in the present example.

COMPARATIVE EXAMPLE

As a comparative example, the first pattern of the black color electrodeposition film BK and the second pattern of the red color electrodeposition film R are formed on a plastic substrate in the same manner as Example 2 except that the waiting times are set so that (i) the time from the end of pre-baking to the exposing of the first pattern and (ii) the time from the end of the heating step for hardening the black color electrodeposition film BK to the exposing of the second pattern are respectively 10 minutes. In other words, a waiting time from (1) the end of the heating step that directly before the exposing to (2) the exposing is 10 minutes, which is less than 60 minutes.

When evaluating the accuracy in superposition of two patterns with respect to 100 substrates that are obtained in the above-described manner, the misalignment between the formed patterns is 13 μm in average and up to 20 μm. Further, relative dimensional differences between the patterns is up to 16 μm, whose accuracy in superposition of patterns is lower than that in Example 2.

As shown in the examples and comparative example, by managing the time between the heating step and the exposing step of the substrate to be not less than the predetermined time, it is possible to form a plurality of patterns with high accuracy of superposition.

As described above, a pattern forming method of the present invention for forming a predetermined pattern on a photosensitive resin film by (i) layering the photosensitive resin film on an inorganic thin film with which a plastic substrate is coated and (ii) exposing the photosensitive resin film via a photomask having the predetermined pattern in an exposing step is arranged so as to include the step of heating the plastic substrate having the inorganic thin film before the exposing step, a time from an end of the heating step to a start of the exposing step being managed to be not less than a predetermined time, in accordance with an asymptotic contracting behavior after the end of the heating step of the plastic substrate having the inorganic thin film.

Compared with the glass substrate, the plastic substrate having the inorganic thin film requires a higher level of technique of dimensional control, thereby having difficulty in achieving accuracy in pattern formation. As for this explanation, the inventors of the present invention have found that the plastic substrate having the inorganic thin film does not immediately become stable in dimension, but keeps asymptotically contracting, after keeping the substrate temperature constant by cooling the substrate following the heating step.

Thus, the high accuracy of dimensional control of the substrate cannot be achieved directly after the heating step, but can be achieved when the contraction rate of the substrate decreases in accordance with the asymptotic contracting behavior. Thus, with managing a time from the end of the heating step to the start of the exposing step of the substrate to be not less than the predetermined time, a predetermined pattern should be formed on the photosensitive resin by exposing the photosensitive resin film via the photomask having a predetermined pattern in the exposing step. This enables the pattern formation with high accuracy of dimension, thereby achieving high accuracy in superposition of patterns when a plurality of patterns are formed.

As a result, it is possible to provide a pattern forming method capable of forming a plurality of patterns on the plastic substrate.

The pattern forming method of the present invention is preferably arranged so that the inorganic thin film is formed by a sputtering method.

With this method, when the inorganic thin film is formed by a sputtering method, in particular, the inorganic thin film is densely formed, thereby surely inhibiting the moisture absorption of the plastic substrate. With this, it is possible to achieve high accuracy of dimensional control of the substrate, thereby achieving high accuracy in superposition of patterns when a plurality of patterns are formed.

The pattern forming method of the present invention is preferably arranged so that the inorganic thin film is formed on both sides of the plastic substrate.

With this method, when the inorganic thin film is formed on both sides of the plastic substrate, the inorganic thin films have an effect on both sides of the plastic substrate, thereby surely inhibiting the moisture absorption of the plastic substrate. With this, it is possible to achieve high accuracy of dimensional control of the substrate, thereby achieving high accuracy in superposition of patterns when a plurality of patterns are formed.

The pattern forming method of the present invention is preferably arranged so that the inorganic thin film is composed of one of silicon oxide, silicon nitride, and indium tin oxide.

With this method, when inorganic thin film is composed of one of silicon oxide, silicon nitride, and indium tin oxide, these inorganic materials, which have particularly excellent property for the barrier layer, can surely inhibit the moisture absorption of the plastic substrate. With this, it is possible to achieve high accuracy of dimensional control of the substrate, thereby achieving high accuracy in superposition of patterns when a plurality of patterns are formed.

The pattern forming method of the present invention is so arranged that dimensions of the plastic substrate having the inorganic thin film keep asymptotically contracting for not less than one hour when kept at a constant ambient temperature after cooling the plastic substrate having the inorganic thin film, the cooling following the heating step.

Namely, the above-described time management becomes useless when the contraction of the plastic substrate having the inorganic thin film cannot be specified in accordance with time elapse.

For example, when the inorganic thin film has too low density, it easily contracts to have higher density in accordance with the contraction of the substrate at the cooling. As a result, the hysteresis phenomenon caused by a difference in coefficient of thermal expansion between the inorganic thin film and the plastic board does not occur. Thus, when the substrate is left after the cooling following the heating, the substrate rapidly expands in a short time by absorbing moisture. Further, though the expansion speed of the substrate is expected to decrease as the moisture content absorbed in the substrate approximates to a saturation value, the substrate exponentially expands in an initial state of the expansion. Thus, slight timing variations cause large variations in dimensions of the formed patterns, resulting in that a process margin cannot be obtained.

Here, with the above-described method, dimensions of the plastic substrate having the inorganic thin film keep asymptotically contracting for not less than one hour when kept at a constant ambient temperature after cooling the plastic substrate having the inorganic thin film, the cooling following heating step. Thus, by managing the time from the end of the heating step to the start of the exposing step of the substrate to be not less than the predetermined time, it is possible to achieve high accuracy of dimensional control of the substrate, thereby achieving high accuracy in superposition of patterns when a plurality of patterns are formed.

The pattern forming method of the present invention is so arranged that the predetermined time is set so that, after the heating step of the plastic substrate having the inorganic thin film, the plastic substrate having the inorganic thin film has a value of dimensional change that is not more than a half of a tolerance accuracy in superposition of formed patterns during 60 minutes from 30 minutes before the predetermined time to 30 minutes after the predetermined time.

The plastic substrate after the heating step contracts asymptotically, so that the speed of contracting the substrate gradually decreases in accordance with time elapse from the end of the heating step. Thus, by providing a predetermined time between the heating step and the exposing step, the variations in the substrate dimensions at the exposing due to the variations in the exposing timing decrease, and thus the variations in the dimensions of the formed patterns decrease when the substrate dimensions become stable. Thus, by setting a time from (1) the end of the heating step to (2) the start of the exposing step so that the variations, together with other pattern misalignment causes such as the accuracy of superposition at the pattern exposing and the accuracy of controlling the temperature of the exposing device, are within a tolerance accuracy in superposition of formed patterns, it is possible to achieve high accuracy in superposition of patterns when a plurality of patterns are sequentially formed. The time from (1) the end of the heating step to (2) the start of the exposing step essentially should be set so that the dimensional variations in the formed patterns when the substrate dimensions become stable are sufficiently smaller than a tolerance accuracy in superposition of formed patterns which is determined based on specifications.

With this method, the predetermined time is set so that, after the heating step of the plastic substrate having the inorganic thin film, the plastic substrate having the inorganic thin film has a value of dimensional change that is not more than a half of a tolerance accuracy in superposition of formed patterns during 60 minutes from 30 minutes before the predetermined time to 30 minutes after the predetermined time.

Namely, with this setting based on actual measurement, it is surely possible to achieve high accuracy of dimensional control of the substrate, thereby achieving high accuracy in superposition of patterns when a plurality of patterns are formed.

The pattern forming method of the present invention is so arranged that the predetermined time is not less than 30 minutes and not more than 150 minutes.

For example, when the inorganic thin film has too high density, the hysteresis behavior of the substrate dimensions becomes large, so that a long time is required until the contraction of the substrate dimensions becomes stable after the heating, and the dimensional behavior varies widely among individual substrates. This increases a time until the start of the exposing step, which is required for achieving the accuracy in superposition of patterns. As described above, because a longer time is required from the end of the heating step to the start of the exposing step, the plastic substrate having an extremely dense inorganic thin film is not preferably used because it is susceptible to a variety of variable factors in an actual manufacturing process, resulting in variations among the inorganic film.

On the other hand, in the substrate that has characteristics in which less than 30 minutes is required until the start of the exposing step in accordance with the hysteresis behavior of the substrate dimensions, the inorganic thin film has too low density, so that it easily contracts to have higher density in accordance with the contraction of the substrate at the cooling. As a result, the hysteresis phenomenon caused by a difference in coefficient of thermal expansion between the inorganic thin film and the plastic board does not occur. Thus, when the substrate is left after the cooling following the heating, the substrate rapidly expands in a short time by absorbing moisture. Further, though the expansion speed of the substrate is expected to decrease as the moisture content absorbed in the substrate approximates to a saturation value, the substrate exponentially expands in an initial state of the expansion. Thus, slight timing variations cause large variations in dimensions of the formed patterns, resulting in that a process margin cannot be obtained.

Thus, with the above-described method, by setting the predetermined time to be not less than 30 minutes and not more than 150 minutes, it is surely possible to achieve high accuracy of dimensional control of the substrate, thereby achieving high accuracy in superposition of patterns when a plurality of patterns are formed.

The pattern forming method of the present invention is so arranged that a time from the end of the heating step to the start of the exposing step of the plastic substrate having the inorganic thin film is not less than the predetermined time and not more than 3 hours plus the predetermined time.

It is not sufficient to manage the time from the end of the heating step to the start of the exposing step of the plastic substrate having the inorganic thin film only to be not less than the predetermined time. Namely, when the leaving time is too long, a dimensional change of the substrate due to expansion by moisture absorption, etc., variations in substrate dimensions, etc. occur, thereby lowering the accuracy of dimensional control of the substrate.

Thus, as in the above-described method, a time from the end of the heating step to the start of the exposing step of the plastic substrate having the inorganic thin film is set to be not less than the predetermined time and not more than 3 hours plus the predetermined time. With this, it is surely possible to achieve high accuracy of dimensional control of the substrate, thereby achieving high accuracy in superposition of patterns when a plurality of patterns are formed.

The pattern forming method of the present invention is preferably arranged so that a waiting step is provided between the heating step and the exposing step of the plastic substrate having the inorganic thin film.

With this method, by providing a waiting step between the heating step and the exposing step of the plastic substrate having the inorganic thin film, it is surely possible to manage a time from the end of the heating step to the start of the exposing step of the substrate to be not less than the predetermined time.

The pattern forming method of the present invention is preferably arranged so that the waiting step is a step for leaving the plastic substrate having the inorganic thin film in ambient conditions in which temperature and humidity are controlled.

With this method, the waiting step is a step for leaving the plastic substrate having the inorganic thin film in ambient conditions in which temperature and humidity are controlled, thereby reducing variations in the asymptotic contracting behavior of the substrate among substrates and among processing steps. With this, it is possible to achieve high accuracy of dimensional control of the substrate, thereby achieving high accuracy in superposition of patterns when a plurality of patterns are formed.

Further, a display device of the present invention is manufactured using the above-described pattern forming method.

With this arrangement, the display device is manufactured using the above-described pattern forming method. With this, it is possible to easily manufacture a high definition display device using the plastic substrate, such as a liquid crystal display device, an organic EL display device, an electrophoresis display device, etc., which was conventionally difficult to be manufactured.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A pattern forming method for forming a predetermined pattern on a photosensitive resin film by (i) layering said photosensitive resin film on an inorganic thin film with which a plastic substrate is coated and (ii) exposing said photosensitive resin film via a photomask having the predetermined pattern in an exposing step, comprising the step of:

heating said plastic substrate having said inorganic thin film before said exposing step, a time from an end of said heating step to a start of said exposing step being managed to be not less than a predetermined time, in accordance with an asymptotic contracting behavior after the end of said heating step of said plastic substrate having said inorganic thin film.

2. The pattern forming method as set forth in claim 1, wherein:

said inorganic thin film is formed by a sputtering method.

3. The pattern forming method as set forth in claim 1, wherein:

said inorganic thin film is formed on both sides of said plastic substrate.

4. The pattern forming method as set forth in claim 1, wherein:

said inorganic thin film is composed of one of silicon oxide, silicon nitride, and indium tin oxide.

5. The pattern forming method as set forth in claim 1, wherein:

dimensions of said plastic substrate having said inorganic thin film keep asymptotically contracting for not less than one hour when kept at a constant ambient temperature after cooling said plastic substrate having said inorganic thin film, the cooling following said heating step.

6. The pattern forming method as set forth in claim 1, wherein:

said predetermined time is set so that, after said heating step of said plastic substrate having said inorganic thin film, said plastic substrate having said inorganic thin film has a value of dimensional change that is not more than a half of a tolerance accuracy in superposition of formed patterns during 60 minutes from 30 minutes before said predetermined time to 30 minutes after said predetermined time.

7. The pattern forming method as set forth in claim 1, wherein:

said predetermined time is not less than 30 minutes and not more than 150 minutes.

8. The pattern forming method as set forth in claim 1, wherein:

a time from the end of said heating step to the start of said exposing step of said plastic substrate having said inorganic thin film is not less than said predetermined time and not more than 3 hours plus said predetermined time.

9. The pattern forming method as set forth in claim 1, wherein:

said heating step is pre-baking of photosensitive resin which composes said photosensitive resin film.

10. The pattern forming method as set forth in claim 1, wherein:

said heating step is carried out for reducing a moisture content of said plastic substrate having said inorganic thin film.

11. The pattern forming method as set forth in claim 1, wherein:

said heating step is carried out for hardening an electrodeposition film on said plastic substrate having said inorganic thin film.

12. The pattern forming method as set forth in claim 1, wherein:

a waiting step is provided between said heating step and said exposing step of said plastic substrate having said inorganic thin film.

13. The pattern forming method as set forth in claim 12, wherein:

said waiting step is a step for leaving said plastic substrate having said inorganic thin film in ambient conditions in which temperature and humidity are controlled.

14. The pattern forming method as set forth in claim 13, wherein:

the temperature and the humidity in said waiting step are the same as temperature and humidity in said exposing step.

15. The pattern forming method as set forth in claim 13, wherein:

the temperature in said waiting step is lower than temperature in said exposing step.

16. The pattern forming method as set forth in claim 13, wherein:

the temperature and the humidity in said waiting step are actively varied.

17. The pattern forming method as set forth in claim 1, wherein:

said photosensitive resin film is made of photosensitive resin capable of being subjected to exposure and development in a plurality of times.

18. The pattern forming method as set forth in claim 17, wherein said heating and exposing steps are repeated more than once, and a time between (1) a start of each of the exposing step and (2) an end of one of the heating steps that directly before the exposing step of (1) is managed so as to be not less than said predetermined time.

* * * * *